United States Patent
Shimonaka

(10) Patent No.: US 6,970,489 B2
(45) Date of Patent: Nov. 29, 2005

(54) SEMICONDUCTOR LASER MODULE, SPATIAL OPTICAL TRANSMISSION SYSTEM AND ELECTRONIC APPLIANCE

(75) Inventor: Atsushi Shimonaka, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 221 days.

(21) Appl. No.: 10/126,967

(22) Filed: Apr. 22, 2002

(65) Prior Publication Data

US 2002/0154667 A1 Oct. 24, 2002

(30) Foreign Application Priority Data

Apr. 20, 2001 (JP) .............................. 2001-122399
Feb. 4, 2002 (JP) .............................. 2002-026725

(51) Int. Cl.[7] .............................................. H01S 5/00
(52) U.S. Cl. .................................... 372/43; 398/130
(58) Field of Search ......................... 372/43; 398/118, 398/130, 140, 165

(56) References Cited

U.S. PATENT DOCUMENTS

| 5,130,563 A | * | 7/1992 | Nabet et al. .................. 706/40 |
| 5,140,384 A | | 8/1992 | Tanaka |
| 5,680,241 A | | 10/1997 | Sakanaka et al. |
| 5,818,619 A | * | 10/1998 | Medved et al. ............. 398/128 |
| 5,986,787 A | | 11/1999 | Ohshima et al. |
| 6,020,590 A | * | 2/2000 | Aggas et al. .......... 250/370.09 |
| 6,198,800 B1 | * | 3/2001 | Garland et al. ............. 378/98.7 |
| 6,310,707 B1 | * | 10/2001 | Kawase et al. ............. 398/119 |
| 6,485,998 B1 | * | 11/2002 | Frahm et al. .................. 438/59 |
| 6,630,994 B2 | * | 10/2003 | Morris et al. ............... 356/215 |

FOREIGN PATENT DOCUMENTS

| EP | 0 491 384 | 6/1992 |
| EP | 0 632 511 | 1/1995 |
| EP | 0 859 255 | 8/1998 |
| EP | 1 079 550 | 2/2001 |
| JP | 60063977 | 4/1985 |
| JP | 4-144396 | 5/1992 |
| JP | 6-252856 | 9/1994 |
| JP | 10-154825 | 6/1998 |
| JP | 10-190584 | 7/1998 |
| JP | 11-26816 | 1/1999 |

OTHER PUBLICATIONS

Singh, J., "Semiconductor Optoelectronics Physics and Technology", McGraw-Hill, Inc., pp. 364-369 and 685.
Introduction to Optical Electronics, A. Yariv, Published by Maruzen Kabushiki Kaisha, 1988, pp. 402-403.

* cited by examiner

Primary Examiner—David Porta
Assistant Examiner—Davienne Monbleau
(74) Attorney, Agent, or Firm—Nixon & Vanderhye P.C.

(57) ABSTRACT

A highly sensitive and inexpensive spatial optical transmission system using an LD (Laser Diode) as a light source and making use of the characteristics of a light receiving element is provided. The system includes a laser chip oscillating a laser beam, and a light receiving element receiving and converting to an electric signal the laser beam emitted from the laser chip and propagated through a space. The laser chip oscillates a laser beam having a wavelength of which absorption coefficient at the light receiving element is in a range of 0.001 to 0.3 $\mu m^{-1}$.

12 Claims, 17 Drawing Sheets

SEMICONDUCTOR LASER MODULE, SPATIAL OPTICAL TRANSMISSION SYSTEM AND ELECTRONIC APPLIANCE

BACKGROUND OF THE INVENTION

1. Field of the Invention

The present invention relates to a spatial optical transmission system for optically transmitting data in a free space. More specifically, it relates to a spatial optical transmission system of which directional full width at half maximum of the transmitted light is wide and which has a diffusion type transmission light source used for the communication distance of at most 10 m, a semiconductor laser module used for the spatial optical transmission system, and to an electronic appliance mounting the spatial optical transmission system or the semiconductor laser module.

2. Description of the Background Art

In a conventional spatial optical transmission system, a light emitting diode (LED) has been used as a light source for the transmission light. As a representative example, an optical transmitting/receiving device of IrDA (Infrared Data Association) shown in FIG. 21 has been known. The optical transmitting/receiving device includes a light emitting diode 112 having a peak wavelength of 850 to 900 nm and a light receiving element 102, and is applied to low speed data link of a short distance.

As a spatial optical transmission system using a semiconductor laser device for optical communication, a spatial optical link system for a space without humans in a normal state has been known. The semiconductor laser device is used in the spatial optical link system, as it has better condensing characteristic than the LED, and hence it is possible to transmit a light beam over a long distance while maintaining luminous flux of a small diameter. In a spatial optical transmission system disclosed in Japanese Patent Laying-Open No. 6-252856, radiation angle of a beam is limited narrow, to realize long distance and high-speed data link. In the spatial optical transmission system, transmission over a few to several kilometers is intended, and in order to suppress attenuation in the air, it is recommended to use a semiconductor laser beam having the wavelength range of 735 nm to 759 nm, 770 nm to 811 nm or 838 nm to 891 nm.

An LED is a non-coherent device and, generally, has a half maximum width of several tens nm. When the peak wavelength is 850 nm, for example, as shown in FIG. 22, the emission band expands to the range of about 750 to 1000 nm. Therefore, when a sharp optical filter is used in a transmitting/receiving device using an LED, the wavelength range that will be cut is wide, lowering signal light intensity. Thus, a sharp optical filter cannot be used. Further, when the LED is used, as the wavelength expands wide, it becomes necessary to expand effective sensitive wavelength band, in designing the light receiving element. When the effective sensitive wavelength band is made wider, however, background noise light such as sunlight or fluorescent lamp increases, so that signal to noise (SN) ratio degrades, and the minimum reception sensitivity lowers, that is, the maximum transmission distance becomes shorter.

When a light receiving element is molded by a resin containing black carbon, the background light on the shorter wavelength side is cut to some extent, and therefore, lower noise is expected. The wavelength of the LED as the transmission light source, however, is inherently wide, and therefore, significant noise reduction is not attained. Further, the color of the semiconductor laser module as a whole is limited to black, which is not very preferable considering the appearance of products such as mini disk players in silver, white or other colors.

In a system disclosed in Japanese Patent Laying-Open No. 6-252856 mentioned above, a semiconductor laser beam having the wavelength range of 735 nm to 759 nm, 770 nm to 811 nm or 838 nm to 891 nm is used, considering attenuation in the air. When radiation directional full width at half maximum is wide, however, light intensity attenuates abruptly as the transmission distance increases. Therefore, the usage is limited for short distance. In this case, it is unnecessary to consider attenuation by air, and oscillation wavelength of the light source is determined from the following different view points.

A light beam having a short wavelength of about 735 to 850 nm is much absorbed by a silicon light receiving element, and is absorbed at the surface of a pn or pin junction photodiode (PD), that is, on the light entering side. Therefore, it is necessary to make a layer on the light entering side efficiently thin. At this time, background light having wavelength shorter than the aforementioned laser beam wavelength is also absorbed at the surface layer, and as the surface layer is thin, it results in a diffusion current, and thus, noise component.

The above described use of the semiconductor laser beam as a light source is simply an application of a semiconductor laser device for spatial transmission, and, as compared with a conventional device using an LED, technical superiority is not very high.

In view of attaining higher technical superiority, it may be possible to use a steep optical filter for reducing background light, as the semiconductor laser device is used as the light source. Mounting of a steep optical filter, however, increases cost of the spatial transmission device, and narrows receivable angle of a receiver. Therefore, this option is industrially impractical.

SUMMARY OF THE INVENTION

Therefore, an object of the present invention is to provide a highly sensitive and inexpensive spatial optical transmission system using a semiconductor laser device as a light source, making use of characteristics of the semiconductor laser beam and the light receiving element.

A further object is to provide a semiconductor laser module used in the spatial optical transmission system, and to provide an electronic appliance mounting the spatial optical transmission system or the semiconductor laser module.

The present invention provides a spatial optical transmission system including a semiconductor laser device oscillating a laser beam, and a light receiving element receiving the laser beam emitted from the semiconductor laser device and propagated through a space and converting the received light beam to an electric signal, wherein the semiconductor laser device oscillates a laser beam having a wavelength of which absorption coefficient at the light receiving element is in the range of 0.001 to 0.3 $\mu m^{-1}$.

When the absorption coefficient at the semiconductor material of the light receiving element is within the aforementioned range, the following phenomenon is observed.

(a) In the case of a semiconductor material (for example, silicon) of the light receiving element of which wavelength dependency of absorption coefficient changes moderately:

In a light receiving element converting an optical signal to an electric signal by an intrinsic semiconductor layer having an impurity conductive type semiconductor layer arranged on a surface side, the SN ratio can surely be improved when the LD (Laser Diode) is used as a light source, rather than the LED.

(b) In the case of a semiconductor material (for example, InP, germanium) of the light receiving element of which wavelength dependency of absorption coefficient changes abruptly:

The light receiving element formed of the above described semiconductor material has a sensitivity only to a narrow wavelength range, for which absorption coefficient changes abruptly, and does not have any sensitivity to light beams of the wavelength out of that range. More specifically, the light beam on the side of shorter wavelength than the aforementioned wavelength range is absorbed too much, and therefore, the light beam cannot reach the intrinsic semiconductor layer. The light beam on the side of longer wavelength than the aforementioned wavelength range is not absorbed but is passed through the intrinsic semiconductor layer. Thus, the light receiving element exhibits the same function as provided by a filter that passes the light of the aforementioned narrow wavelength range. As a result, when an LED having emission wavelength range wider than the aforementioned narrow wavelength range is used, the light beams having the wavelength other than the aforementioned narrow range do not contribute to signal transmission, and hence signal light intensity lowers significantly. By contrast, an LD emitting light beam of approximately single wavelength is capable of emitting light having the wavelength within the aforementioned narrow wavelength range. Thus, the signal light intensity is not lowered. Thus, as compared with the LED, extremely high SN ratio is ensured.

In both cases (a) and (b), when a semiconductor laser device LD is used, an SN ratio higher than obtained by the conventional spatial optical transmission system using an LED can be obtained.

As to the semiconductor laser device and the light receiving element, what is necessary is that a semiconductor laser device is provided on at least one, and a light receiving element on the other, of two devices between which optical transmission is performed.

In the spatial optical transmission system according to the present invention, the semiconductor laser device may oscillate laser beam having a wavelength of which absorption coefficient at the light receiving element is in the range of 0.007 to 0.04 $\mu m^{-1}$.

When the light receiving element is formed of silicon, in the aforementioned range of absorption coefficient, the spatial optical transmission system emitting the light beam having such a wavelength that results in the absorption coefficient of the aforementioned range by using an LD surely provides an SN ratio much higher than the conventional system using an LED.

In the spatial optical transmission system of the present invention, the semiconductor laser device may oscillate a laser beam having a wavelength of which absorption coefficient at the light receiving element is in the range of 0.02 to 0.3 $\mu m^{-1}$.

When the light receiving element is formed of InP or germanium, the spatial optical transmission system using an LD having the absorption coefficient in the aforementioned range comes to have the same function as provided by a sharp optical filter. Therefore, an SN ratio much higher than attained by the conventional system using an LED can surely be attained.

In the spatial optical transmission system of the present invention, the light receiving element may be formed of a silicon based photodiode, and the oscillation wavelength of the semiconductor laser device may be in the range of 885 to 980 nm.

When the wavelength of the laser beam that is approximately a single wavelength emitted from the semiconductor laser device is within the aforementioned range, the absorption coefficient in silicon is in the range of 0.007 to 0.04 $\mu m^{-1}$. With the absorption coefficient within such a range, the SN ratio attained by using an LD in a silicon light receiving element converting an optical signal to an electric signal by an intrinsic semiconductor silicon layer having an impurity conductive type silicon layer arranged at the surface side is significantly increased than when an LED is used.

In the spatial optical transmission system of the present invention, the light receiving element may be formed of an InP based photodiode, and oscillation wavelength of the semiconductor laser device may be in the range of 900 to 945 nm.

With this wavelength range, the absorption coefficient of InP forming the light receiving element is in the range of 0.02 to 0.3 $\mu m^{-1}$. As the wavelength dependency of the absorption coefficient of InP changes abruptly in the aforementioned wavelength range, the same state can be attained as attained when a filter transmitting the light beam of narrow wavelength range of 900 to 945 nm is added. Thus, the SN ratio of the present spatial optical transmission system using an LD is significantly improved than the conventional system using an LED.

In the spatial optical transmission system of the present invention, the light receiving element may be formed of a Ge based photodiode, and oscillation wavelength of the semiconductor laser device may be in the range of 1550 to 1590 nm.

In the spatial optical transmission system of the present invention, the light receiving element may be formed of an Si based or InP based photodiode, and it may include, starting from the entering surface side where the laser beam enters, a first conductivity type semiconductor layer having the thickness of 5 to 25 $\mu m$, an intrinsic semiconductor layer having the thickness of 60 to 200 $\mu m$ positioned below the first conductivity type semiconductor layer, and a second conductivity type semiconductor layer positioned below the intrinsic semiconductor layer.

The structure of the light receiving element described above is optimized to obtain a good SN ratio, when an LD is used as a light source and the light receiving element is formed of silicon or indium phosphide.

In the spatial optical transmission system of the present invention, the light receiving element may be formed of a Ge based photodiode, and it may include, starting from the entering surface side where the laser beam enters, a first conductivity type semiconductor layer having the thickness of 20 to 40 $\mu m$, an intrinsic semiconductor layer having the thickness of 60 to 250 $\mu m$ positioned below the first conductivity type semiconductor layer, and a second conductivity type semiconductor layer positioned below the intrinsic semiconductor layer.

The structure of the light receiving element described above is optimized to obtain a good SN ratio, when an LD is used as a light source and the light receiving element is formed of germanium.

A semiconductor laser module in accordance with a first aspect of the present invention may include a circuit board, a semiconductor laser device mounted on the circuit board, a silicon based resin as a jellied resin of which JIS-A hardness after curing is approximately zero, covering at least a light emitting end surface of the semiconductor laser device, and another, sealing resin sealing the semiconductor laser device covered by the silicon based resin, on the circuit board.

As the semiconductor laser device is covered by the jellied resin, an unnecessarily high stress or the like is not applied to the semiconductor laser device, and stable and satisfactory laser light emission characteristic can be obtained, as compared with a rubber like resin.

The semiconductor laser module in accordance with the present inventions mentioned above may include a circuit board, a semiconductor laser device attached to the circuit board and arranged with its light emitting surface positioned approximately parallel to a surface of the circuit board, and a sealing resin sealing the semiconductor laser device on the circuit board.

As the light emitting surface is arranged to be approximately parallel to the surface of the circuit board, it becomes possible to emit the laser beam with a good radiation pattern, to the light receiving element of the counterpart of communication. As a result, as compared with a structure in which the light is reflected by a concave side surface formed in the circuit board to have the light extracted at an upper surface, superior radiation pattern can be obtained, not influenced by the smoothness or the like of the aforementioned concave side surfaces.

In the semiconductor laser module according to the present inventions mentioned above, the semiconductor device may be fixed on a mounting member fixed on the circuit board, and the light emitting surface may be made approximately parallel to the surface of the circuit board.

As the shape of the mounting member can be set freely, when the mounting member is used, the difficulty in attaching the light emitting surface of the semiconductor laser device approximately parallel to the surface of the circuit board is no longer a serious concern. As a result, degree of freedom in setting optical path of the semiconductor laser device can be increased. Further, wiring between an electrode of the circuit board and an electrode of the semiconductor laser device is facilitated.

In the semiconductor laser module according to the second aspect, the mounting member preferably includes a heat sink.

By the provision of the heat sink, temperature increase of the semiconductor laser device can significantly be suppressed.

The spatial optical transmission system of the present invention may include any of the semiconductor laser modules described above that emits a laser beam to a light receiving element of the counterpart.

Because of this structure, a semiconductor laser device that has stable and good radiation pattern can be provided, and signal transmission with higher reliability is attained.

The electronic appliance of the present invention responds to data optically transmitted through a space, and includes any of the above described spatial optical transmission systems or any of the above described semiconductor laser modules.

By this structure, convenience of operation and reliability of the electronic appliance by remote control, for example, can be enhanced. Further, as superior SN ratio is obtained, it becomes unnecessary to seal the semiconductor laser module including the light receiving element by black carbon or the like for cutting short wavelength component of the background noise. Thus, metallic color, a transparent colored resin or the like may be used. Thus, esthetic design of the electronic appliance can be improved, and thus, value of the product can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A to 6D represent relation between the structure of the light receiving element and the SN ratio, when an LED is used as a light source, in which FIG. 6A shows an example having the central wavelength of 850 nm, FIG. 6B shows an example having the central wavelength of 90 nm, FIG. 6C represents an example having the central wavelength of 950 nm and FIG. 6D represents an example having the central frequency of 1000 nm.

FIGS. 7A to 7D represent relation between the structure of the light receiving element and the SN ratio, when an LD is used as a light source, in which FIG. 7A shows an example having the wavelength of 850 nm, FIG. 7B shows an example having the wavelength of 900 nm, FIG. 7C shows an example having the wavelength of 950 nm and FIG. 7D shows an example having the wavelength of 1000 nm.

FIGS. 10A to 10D represent relation between the total thickness of a p layer and an i layer and the SN ratio when an InP based PD is used as a light receiving element and an LED is used as a light source, in which FIG. 10A represents an example having the peak wavelength of 900 nm, FIG. 10B represents an example having the peak wavelength of 920 nm, FIG. 10C represents an example having the peak wavelength of 940 nm, and FIG. 10D represents an example having the peak wavelength of 960 nm.

FIGS. 11A to 11D represent relation between total thickness of a p layer and an i layer and the SN ratio, when an InP based PD is used as the light receiving element and a semiconductor laser element LD is used as the light source, in which FIG. 11A represents an example having the peak wavelength of 900 nm, FIG. 11B represents an example having the peak wavelength of 920 nm, FIG. 11C represents an example having the peak wavelength of 940 nm, and FIG. 11D represents an example having the peak wavelength of 960 nm.

FIGS. 13A to 13D represent relation between the total thickness of a p layer and an i layer and the SN ratio, when a Ge based PD is used as the light receiving element and an LED is used as a light source, in which FIG. 13A represents an example having the peak wavelength of 1520 nm, FIG. 13B represents an example having the peak wavelength of 1540 nm, FIG. 13C represents an example having the peak wavelength of 1560 nm, and FIG. 13D represents an example having the peak wavelength of 1580 nm.

FIGS. 14A to 14D represent relation between the total thickness of a p layer and an i layer and the SN ratio when a Ge based PD is used as the light receiving element and a semiconductor laser device LD is used as a light source, in which FIG. 14A represents an example having a peak wavelength of 1520 nm, FIG. 14B represents an example having the peak wavelength of 1540 nm, FIG. 14C represents an example having the peak wavelength of 1560 nm, and FIG. 14D represents an example having the peak wavelength of 1580 nm.

DESCRIPTION OF THE PREFERRED EMBODIMENTS

Embodiments of the present invention will be described with reference to the figures.

(First Embodiment)

Figure 1:
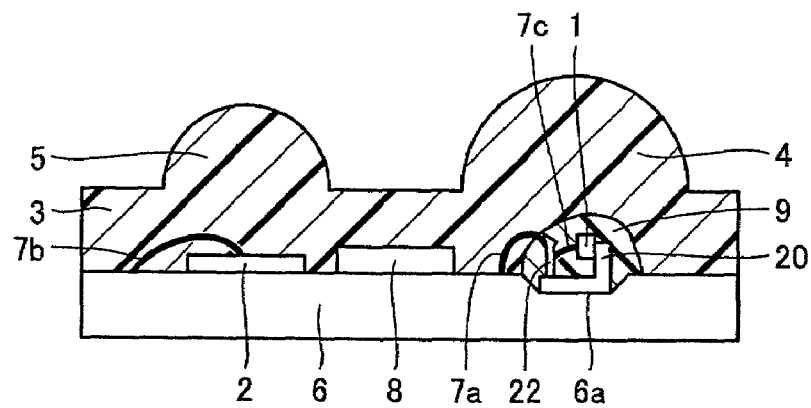
FIG. 1 is a cross sectional view showing a spatial optical transmission module in accordance with a first embodiment of the present invention.
Figure 2:
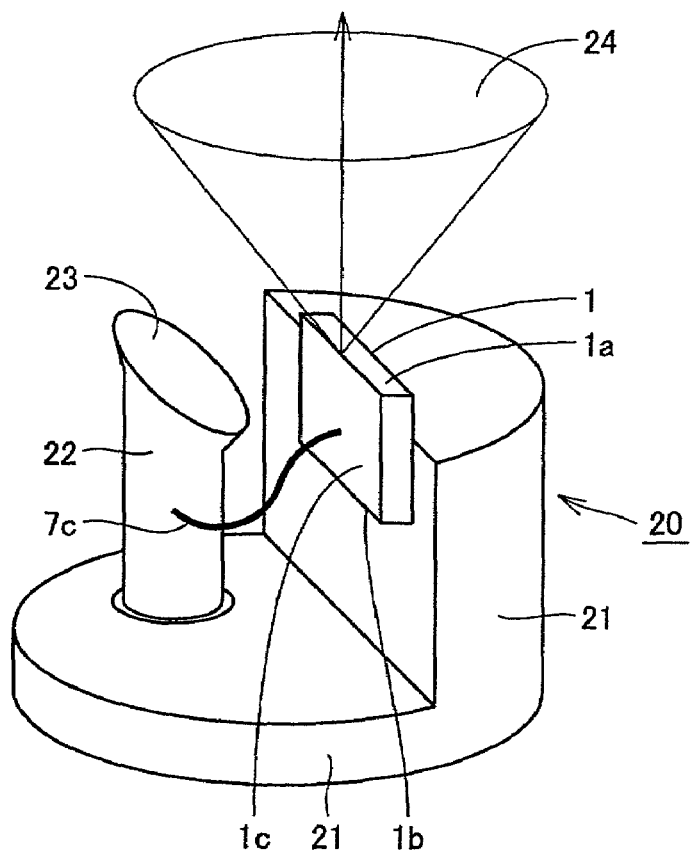
FIG. 2 is a perspective view showing a semiconductor laser module in the spatial optical transmission module of FIG. 1.
Figure 3:
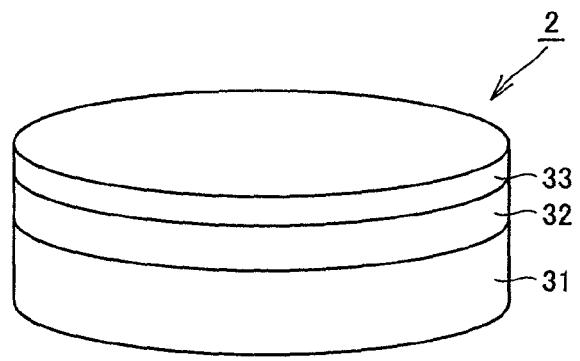
FIG. 3 is a perspective view showing a light receiving element in the spatial optical transmission module of FIG. 1.

FIG. 1 is a cross sectional view showing the spatial optical transmission module of the spatial optical transmission system in accordance with the first embodiment of the present invention. FIG. 2 is a perspective view showing the portion of the light source, and FIG. 3 is a perspective view showing the light receiving element. In the present embodiment, an InGaAs based semiconductor laser device (laser chip) 1 having oscillation wavelength of 890 nm is used as the light source, and a pin photodiode of silicon (Si) is used as the light receiving element. In the spatial optical transmission system, it is assumed that the counterpart transmitting/receiving signals also has the same spatial optical transmission module as described above.

Referring to FIG. 1, on a circuit board 6, a pattern of both positive and negative electrodes for driving a semiconductor laser is formed, and as can be seen from the figure, a recessed portion 6a having the depth of 300 μm is provided at a portion at which the laser chip is mounted. At the recessed portion 6a, a laser mount (mounting member) 20 on which laser chip 1 is mounted, is fixed. A flat portion 23 of a positive electrode 22 of laser mount 20 is electrically connected, by a wire 7a, to a positive electrode portion (not shown) for driving laser on circuit board 6. Recessed portion 6a has such a depth that does not hinder radiation of a laser beam, and surface roughness is adapted such that it does not affect radiation angle.

Light receiving element 2 is also mounted on circuit board 6, and an electric signal is taken out by a wire 7b. In addition, an IC circuit 8 for driving laser/processing received signal is mounted on the circuit board.

Thereafter, at the portion where the laser mount 20 fixed at the recessed portion by solder, a liquid silicon resin 9 is dropped by an appropriate amount. Silicon resin 9 remains in the recessed portion because of surface tension, covers the laser mount 20 and fixes the same on recessed portion 6a. Though a recessed portion is provided in circuit board 6 for mounting laser mount 20 in the present embodiment, silicon resin 9 remains at the surface and in the vicinity of the laser chip because of surface tension as described above, and therefore, the recessed portion is not always necessary.

Thereafter, the resulting body is left at 80° C. for about 5 minutes, so that the resin is cured to a jelly. Thereafter, a transparent epoxy based resin mold 3 is provided as a coverage. At an upper surface of the laser chip, a lens portion 4 for controlling radiation angle is formed, and at an upper surface of the light receiving element, a lens portion 5 for collecting signal light, are respectively formed, integrally as mold lenses.

As described above, it is assumed that in the present spatial optical transmission system, the counterpart has the same spatial optical transmission module, for performing transmission and reception of optical signals. The optical signal emitted from the light source bearing information is received by the receiving element of the counterpart spatial optical transmission module, and the optical signal emitted from the counterpart is received by the above described receiving element.

Next, laser mount 20 will be described with reference to FIG. 2. As can be seen from FIG. 2, laser chip 1 is die-bonded on an L-shaped heat sink 21. Laser chip 1 is an InGaAs based semiconductor laser device, having a chip lower surface 1b coated with a highly reflective film. Generally, the highly reflective film also serves to provide an end surface of the laser chip. A light taking surface of laser chip upper surface 1a is not coated, and a reflection surface is formed by cleavage. In the present embodiment, pre-coating with silicon resin is performed, which precoat film also has the function of protecting the end surface of the laser chip. Thus, the step of providing an end surface protective coating, which is one of the causes of increased cost, can be reduced to ½. It is needless to say that both upper and lower end surfaces may be coated. In that case, an effect that the reflectance can be designed to a desired value, is attained.

At a base portion 21b of heat sink 21, a positive electrode 22 is fixed with an insulator, so as to prevent conduction with heat sink 21. Positive electrode 22 is connected to a surface 1c of laser chip 1 by a gold-plated tungsten wire 7c. As already described, laser mount 20 is fixed by solder on a negative electrode (not shown) of circuit board 6 shown in FIG. 1, and a flat portion 23 at the upper portion of positive electrode 22 is connected to a positive electrode portion (not shown) of circuit board 6 by means of a wire 7a. By the formation of such wirings, it becomes possible to oscillate the laser chip and to obtain a laser beam 24.

Function of the spatial optical transmission module in accordance with the present embodiment will be described in the following. The oscillation wavelength of laser chip 1 as a light source is about 890 nm, and considering process accuracy at the time of production, the overall laser chip has the oscillation wavelength accuracy within 890±1 nm. Further, variation in oscillation wavelength caused by temperature change is also suppressed to at most a few nm. Thus, the chip can be considered as a light emitting device having single oscillation wavelength.

The silicon light receiving element 2 will be described in the following. FIG. 3 shows the light receiving element, which has, on an n type silicon substrate 31, an intrinsic region 32 (depletion layer, i layer: intrinsic layer) having the thickness of 100 μm, and a p type region 33 having the thickness of 10.5 μm. When a light beam of short wavelength having an energy larger than the bandgap of silicon enters from the side of the upper p layer 33, the light beam is absorbed and it can be taken out as an electric signal. An average depth at which the light is absorbed is referred to as a mean free path λ, and the reciprocal thereof is referred to as an absorption coefficient α. When a light beam having photon number N at the surface proceeds through a silicon light receiving element in the depth direction, the number N' of surviving photons at a depth x can be given by the following equation (1).

$$N' = N\exp(-x/\lambda) = N\exp(-\alpha x) \quad (1)$$

The photons absorbed in depletion layer 32 can be taken out as an electric signal. However, only those of the photons absorbed in the p layer or the n layer which have reached the depletion layer by diffusion phenomenon can be taken out as an electric signal. Generally, diffusion length of silicon is about 1 to 10 μm. Therefore, the efficiency of taking out the electric signal when photons are absorbed by the p or n layer is quite low. Further, as the diffusion rate is slow, modulation of optical signal at high speed cannot be followed, and hence an effective electric signal cannot be obtained. For further details, see, for example, *Introduction to Optical Electronics*, (A. Yariv, Published by Maruzen Kabushiki Kaisha, 1988).

Figure 4:
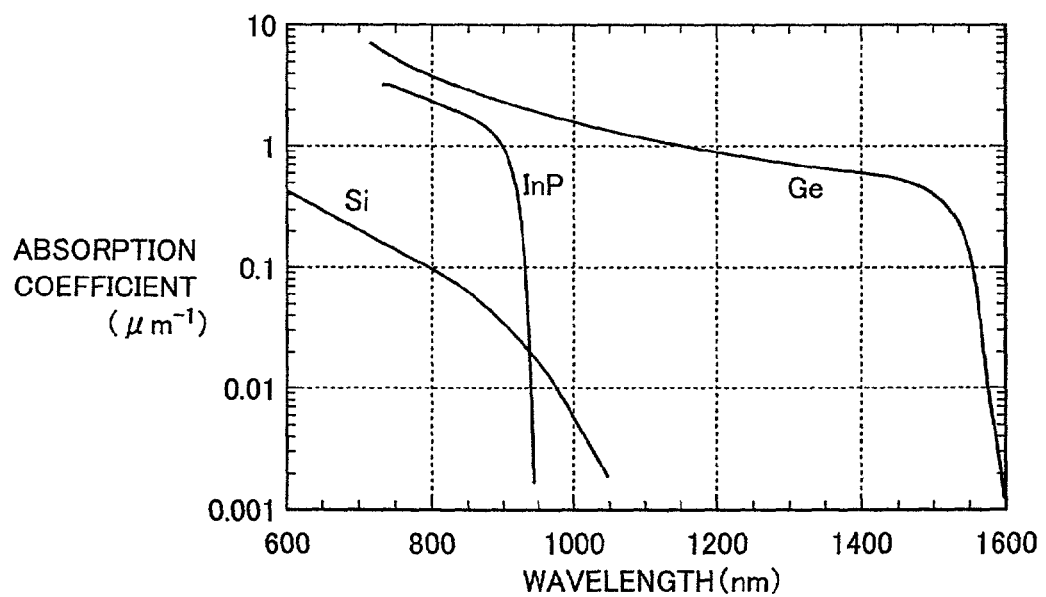
FIG. 4 represents wavelength dependency of absorption coefficient of the semiconductor material of the light receiving element.

FIG. 4 represents wavelength dependency of absorption coefficient of silicon (Si), indium phosphide (InP) and germanium (Ge) as semiconductor photodiode materials that form the light receiving element. In Si, emission and absorption of light take place in indirect transition, and therefore, rise of the absorption coefficient from the longer wavelength side to the shorter wavelength side is moderate. By contrast, in InP and Ge, the band structure makes direct or nearly direct transition, and therefore, the aforementioned rise of the absorption coefficient is steep.

In the present embodiment, a light emitting element having Si arranged as the semiconductor photodiode material (hereinafter referred to as an Si light receiving element) is used. It can be seen from FIG. 4 that in Si, the absorption coefficient at a wavelength of 1000 nm or higher is 1/10 or lower than the absorption coefficient on the shorter wavelength side having the wavelength of 800 nm or lower. On the shorter wavelength side of 800 nm or lower, it can be confirmed from equation (1) or the like that at least 63% is absorbed, when Si having the thickness of 10 μm is used.

Figure 5:
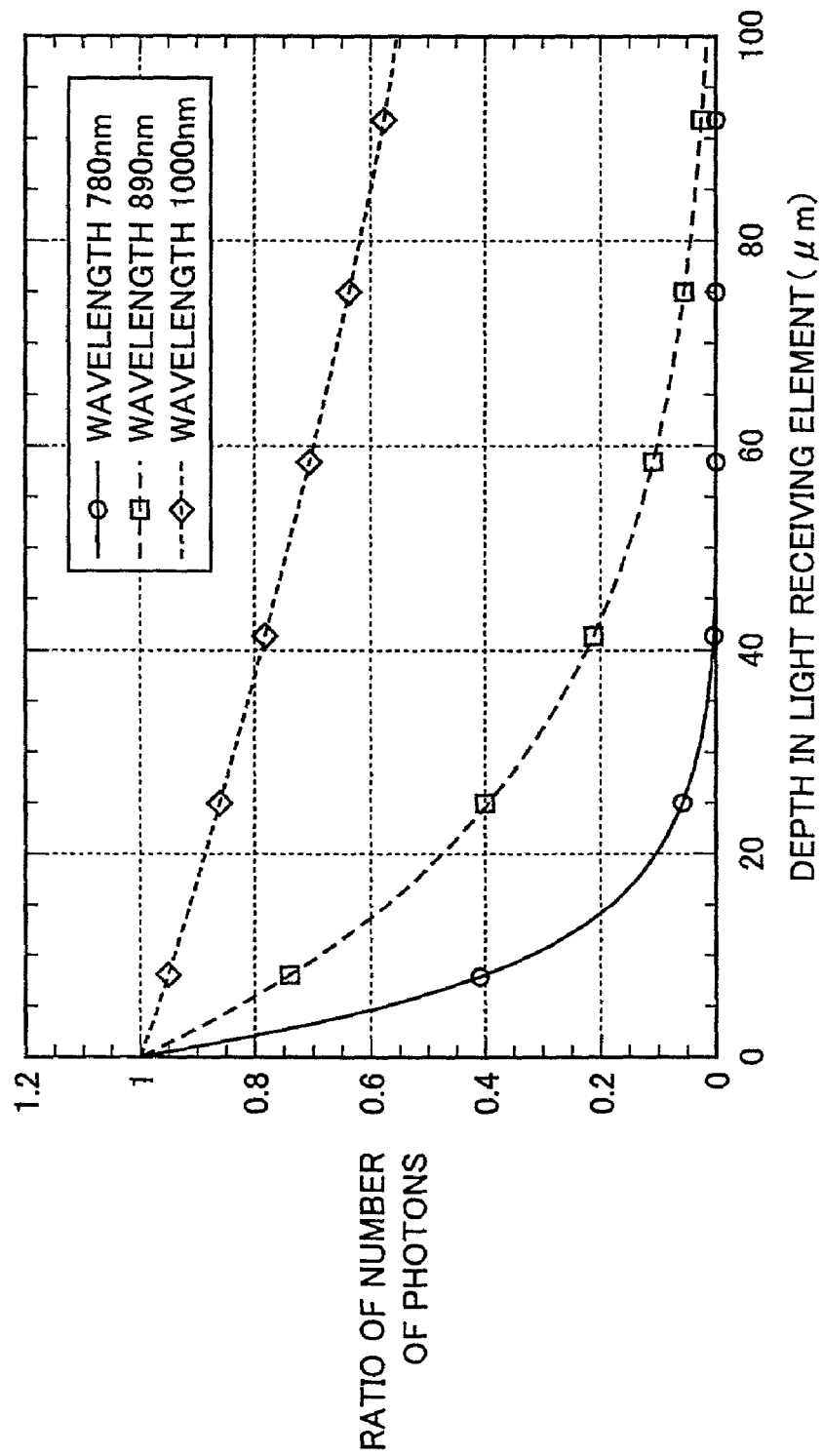
FIG. 5 represents number of surviving photons in the silicon forming the light receiving element in accordance with the first embodiment of the present invention.

FIG. 5 represents relation between the depth in the Si light receiving element and the number of photons surviving at the depth, in accordance with the equation (1). The number of surviving photons at the depth is represented as the ratio between the number of photons at that depth and the number of photons at the surface (photon number ratio). In the present embodiment, the laser beam having the wavelength of 890 nm corresponds to the absorption coefficient of 0.04 μm$^{-1}$ from FIG. 4.

Based on the absorption coefficient, it can be understood from the calculation in accordance with equation (1) that the light is absorbed by 30% at the upper p layer 33 and 68% at the next i layer 32 of the light receiving element shown in FIG. 3. More specifically, approximately 68% of the laser beam that entered the light receiving element is absorbed by the i layer 32 of light receiving element 2 and converted to an electric signal. Generally, background light is distributed over the entire sensitive wavelength range of the silicon light receiving element, and the background light on the shorter wavelength side that is much absorbed, is absorbed with high efficiency by the light receiving element and results in noise current. In the present embodiment, the thickness of p layer 33 is increased to 10.5 μm. Therefore, as shown in FIG. 5, the light beam on the shorter wavelength side having the wavelength of 780 nm, for example, is absorbed by about 70% on the p layer at the surface side, and not easily taken out as an electric signal, and not resulting in a large noise.

Comparison experiments is performed, using the semiconductor laser device and the LED as light emitting elements. As comparative examples, 7 different LEDs having the central wavelengths of 850, 875, 900, 925, 950, 975 and 1000 nm were used, and as the examples of the present invention, 7 different semiconductor laser devices having oscillation wavelengths of 850, 875, 900, 925, 950, 975 and 1000 nm were used. Optimal design was performed while changing the thickness of p layer 33 and i layer 32 of the light receiving elements for respective wavelength bands of the light emitting elements, and signal to noise ratio (SN ratio) at the time of actual signal reception was measured. The measurement was performed under the condition same as for the common communication: fine day time, in a room with a window, with a fluorescent lamp on.

FIGS. 6A to 6D show the results when the LEDs were used. FIGS. 6A to 6D are graphs representing dependency of SN ratio on (p layer thickness+i layer thickness), corresponding to the central wavelengths of 850, 900, 950 and 1000 nm. More specifically, the abscissa represents the total thickness of p and i layers, and the thickness of p layer is changed as a parameter.

Figure 6A:
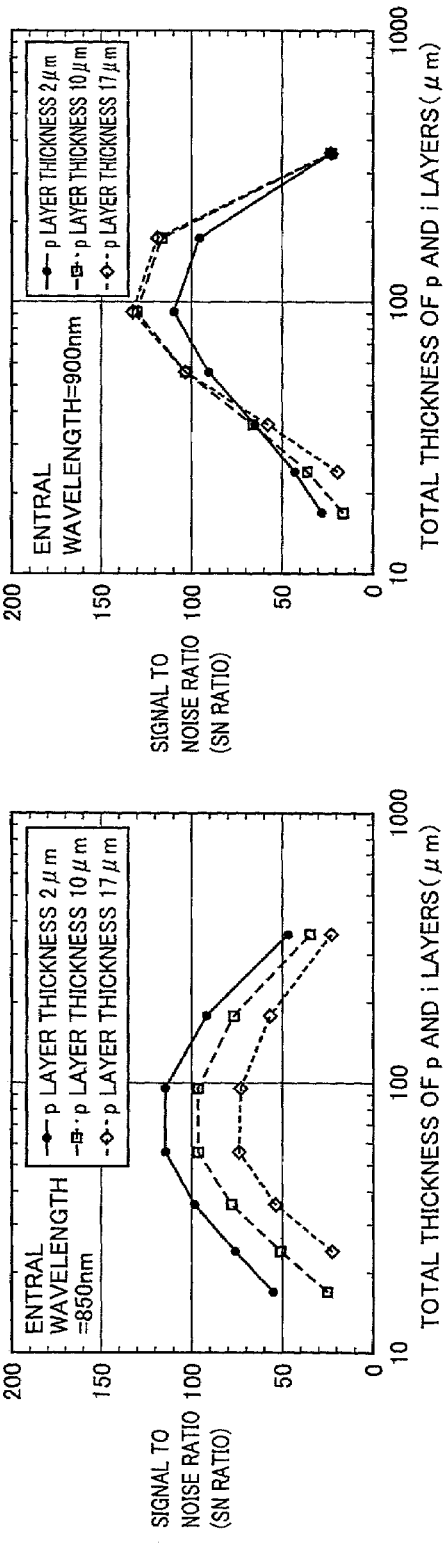

In FIG. 6A, showing the example having the wavelength of 850 nm, there is a tendency that SN ratio increases when the p layer is thin. The reason for this is that much light is absorbed at a shallow portion of the light receiving element, as absorption coefficient for the light of shorter wavelength is large. When the p layer is made thin, the capability to remove background light of shorter wavelength decreases. In order to improve overall reception sensitivity, it can be understood from FIG. 6A, that the thickness of the i layer should preferably be about 50 to 100 μm. When it is made thicker, noise caused by the background light on the longer wavelength side increases.

Figure 6B:
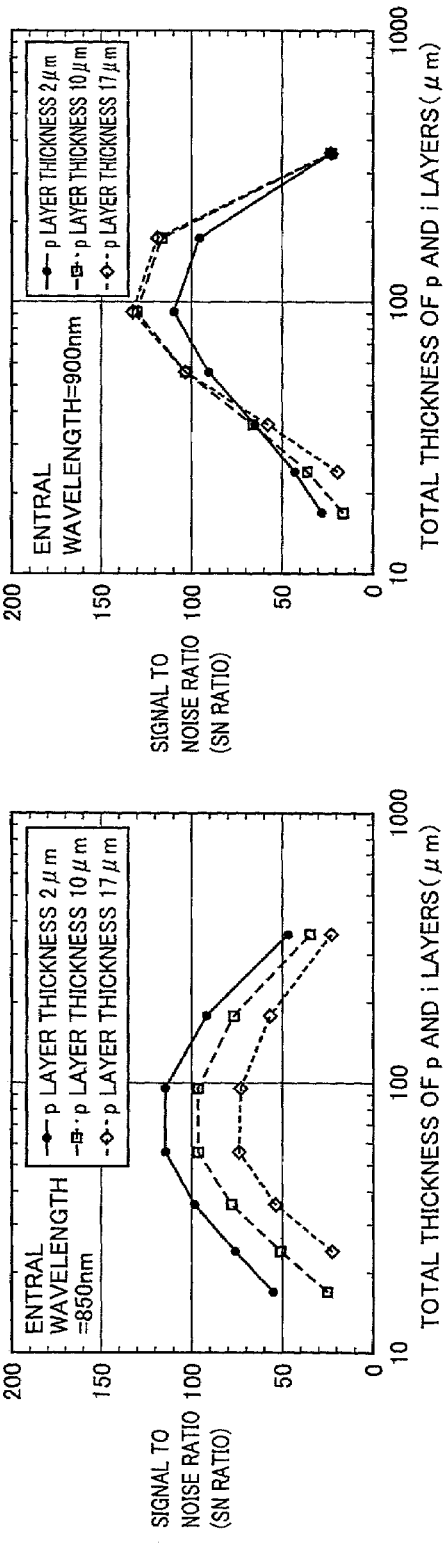
Figure 6C:
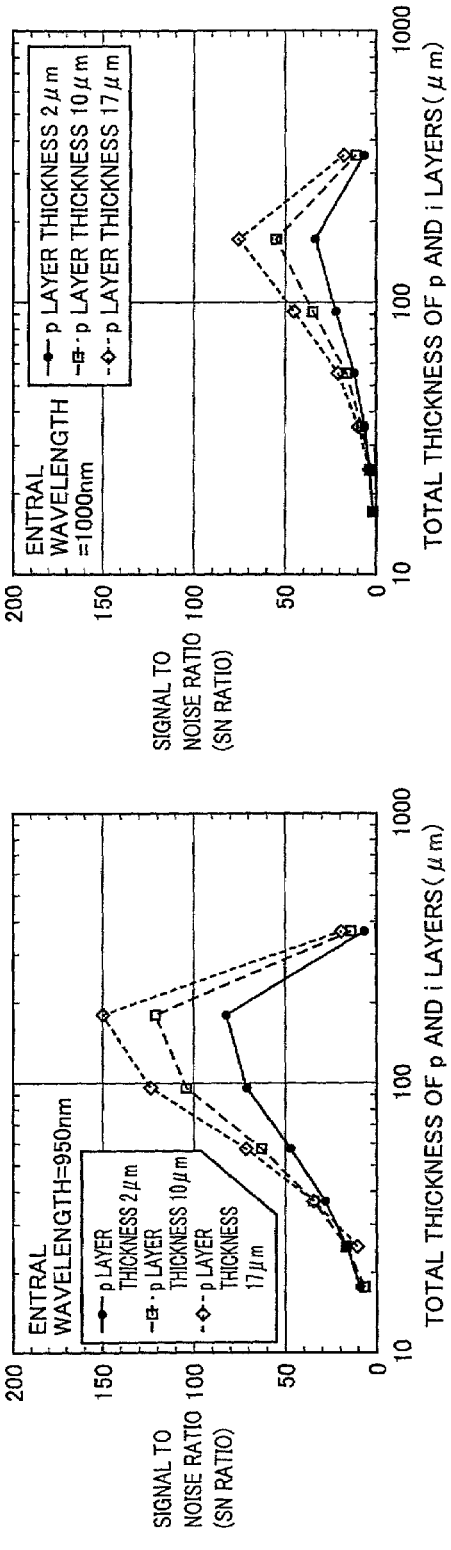
Figure 6D:
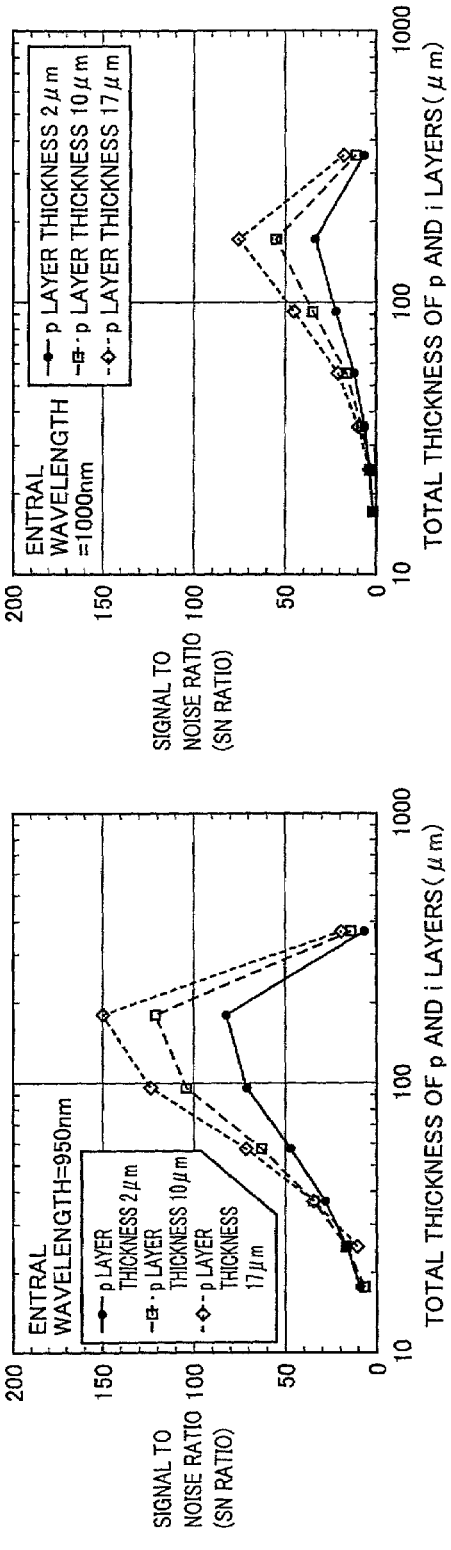
Figure 7A:
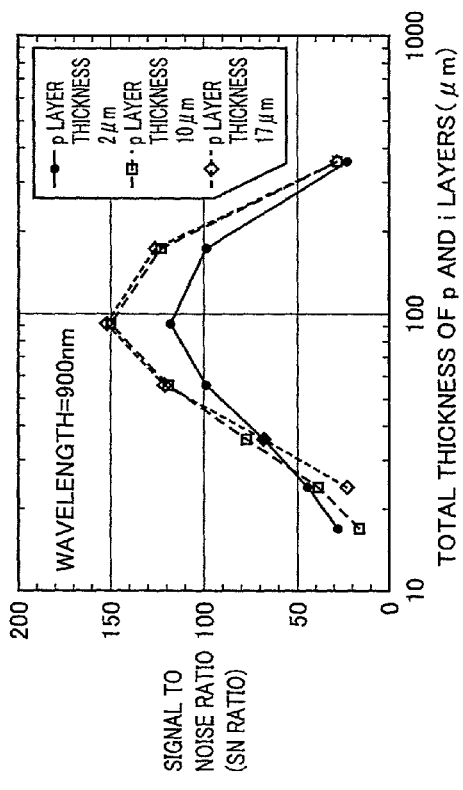
Figure 7B:
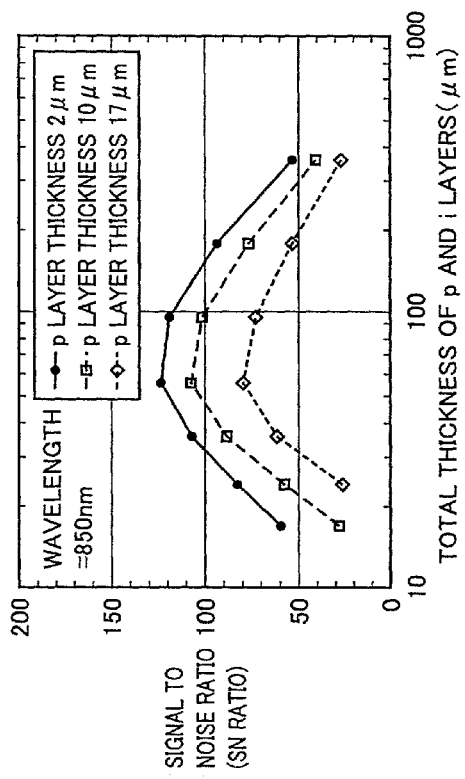
Figure 7C:
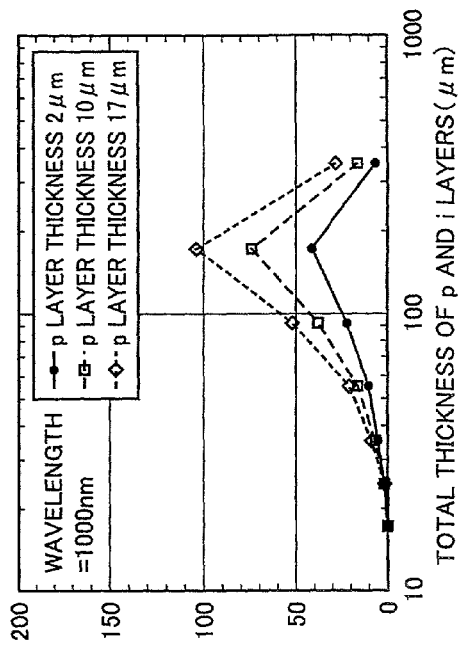
Figure 7D:
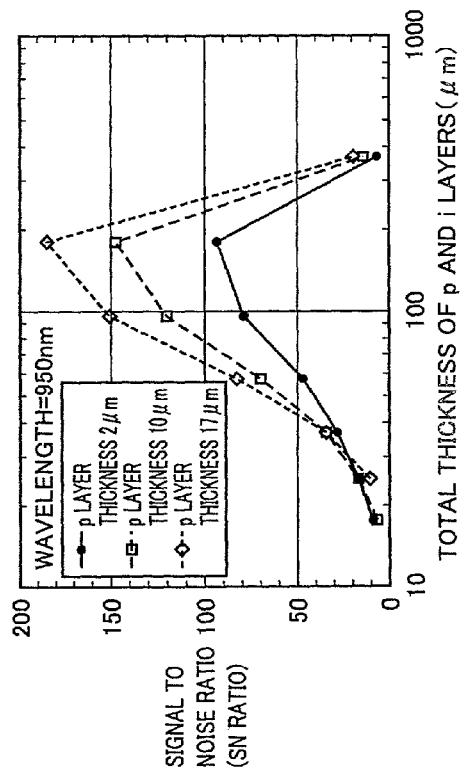

As can be seen from FIGS. 6B and 6C, when the central wavelength is made longer, the optimal thickness of p layer and i layer increases, and accordingly, the SN ratio also increases. When the wavelength is made still longer, the SN ratio degrades as shown in FIG. 6D. The main cause thereof is the insufficient thickness of the i layer. When an i layer having the thickness of 300 μm or more is employed, substantially, electric field strength in the i layer lowers, and it is confirmed that the signal becomes weak.

Examples using semiconductor laser devices will be described with reference to FIGS. 7A to 7D. FIGS. 7A to 7D correspond to the oscillation wavelength of 850, 900, 950 and 1000 nm of the semiconductor laser device, respectively. The tendency observed from the result of measurement shown in FIGS. 7A to 7D is similar to the result shown in FIGS. 6A to 6D. It is noted, however, that the magnitude of the SN ratio tends to be larger in case of semiconductor laser devices (FIGS. 7A to 7D).

Figure 8:
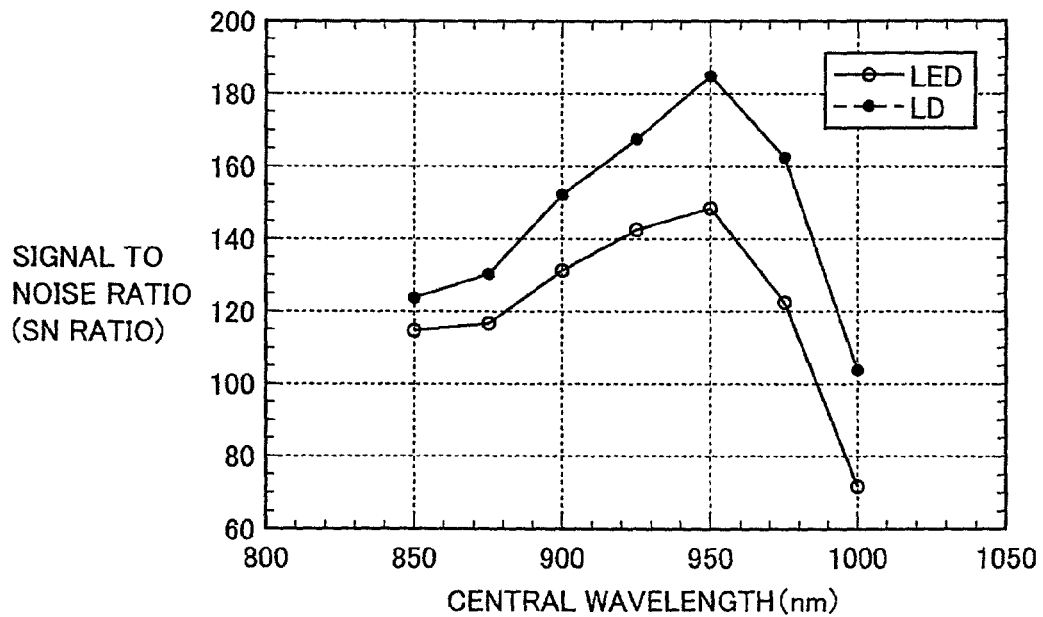
FIG. 8 represents relation between (central) wavelength and optimized SN ratio in the silicon light receiving element in accordance with the first embodiment of the present invention.

FIG. 8 represents the maximum SN ratio obtained when the thicknesses of the p and i layers of the light receiving element are optimized in accordance with the wavelength. From FIG. 8, it is understood that even when the light receiving element is improved, that is, optimized, the maximum SN ratio is about 150 in case of the LED. More specifically, when an LED is used, it is impossible to exceed the minimum SN ratio of about 150 that can be attained when a semiconductor laser device having the oscillation wavelengths of 885 to 980 nm is used. More specifically, when a semiconductor laser device having the wavelength band of 885 to 980 nm and an Si light receiving element are used in a spatial optical transmission system, an SN ratio that is higher than any spatial optical transmission system that uses an LED of any wavelength band and an Si light receiving element can be attained. The wavelength band corresponds to the range of the absorption coefficient of 0.07 to 0.04 $\mu m^{-1}$ for silicon, from FIG. 4. When the semiconductor laser device of this wavelength band is used, it has been found that the optimal condition for the thickness of respective layers forming the light receiving element is that p layer is 5 to 25 $\mu m$ and i layer is 60 to 200 $\mu m$.

By the laser mount 20 used in the present invention, the laser beam can be taken out vertical to the circuit board, as already described. Other than the system having such a structure, a method has also been tried in which the light beam is reflected by a side surface of a recessed portion formed in the circuit board 6 to take the light beam at the upper surface side. Satisfactory radiation pattern could not be obtained, however, as smoothness of the side surface of the recessed portion was insufficient. By using a laser mount that takes out the laser beam vertical to the circuit board as described above, satisfactory radiation pattern can be obtained, and an SN ratio larger than that of the LED can be attained.

Further, as a large heat sink 21 is used, temperature increase of semiconductor laser device 1 can be suppressed. When the laser device 1 is mounted directly at the recessed portion, thermal resistance is 250 deg/W. When the laser mount 20 is used, the thermal resistance can be reduced to about ⅓, that is, 80 deg/W.

Silicon resin 9 used for covering laser chip 1 described above is a so-called jellied resin, which has JISA hardness after curing of 0. Some rubber like resin materials having JISA hardness larger than 0 were tried. It was confirmed, however, that highest reliability is attained when a jellied resin is used.

(Second Embodiment)

The second embodiment of the present invention will be described next. The structure of the spatial optical transmission module of the second embodiment is the same as that shown in FIG. 1. In the present embodiment, the oscillation wavelength of semiconductor laser device 1 is set to 930 nm. The oscillation wavelength of laser chip 1 can be adjusted by adjusting the ratio of mixed crystal of active layer InGaAs. As the light receiving element, a light receiving element of an InP based compound semiconductor was used. The thickness of the p layer and the thickness of the i layer of the light receiving element was set to 3 $\mu m$ and 15 $\mu m$. The SN ratio was measured under the same condition as the first embodiment, and the obtained SN ratio was 400.

The optical transmission device described above will be discussed in greater detail. It can be seen from FIG. 4 that a light beam having the wavelength around 930 nm has absorption coefficient of about 0.07 $\mu m^{-1}$ in the InP light receiving element 2. The absorption coefficient for the light beam having the wavelength of 900 nm is about 1.0 $\mu m^{-1}$. Further, the absorption coefficient for the light beam of longer wavelength side, for example, having the wavelength of 950 nm, is 0.005 $\mu m^{-1}$. From these absorption coefficients and the equation (1), the ratio of surviving photons at a prescribed depth of the light incident on InP can be found.

Figure 9:
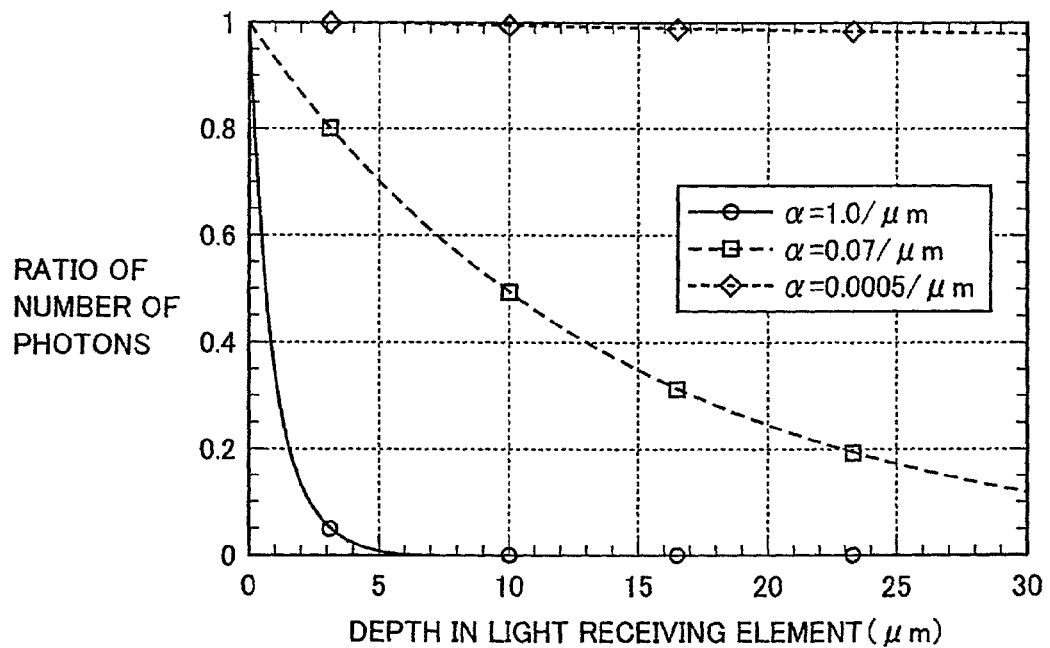
FIG. 9 represents the number of surviving photons, in the InP light receiving element in accordance with a second embodiment of the present invention.
Figure 10A:
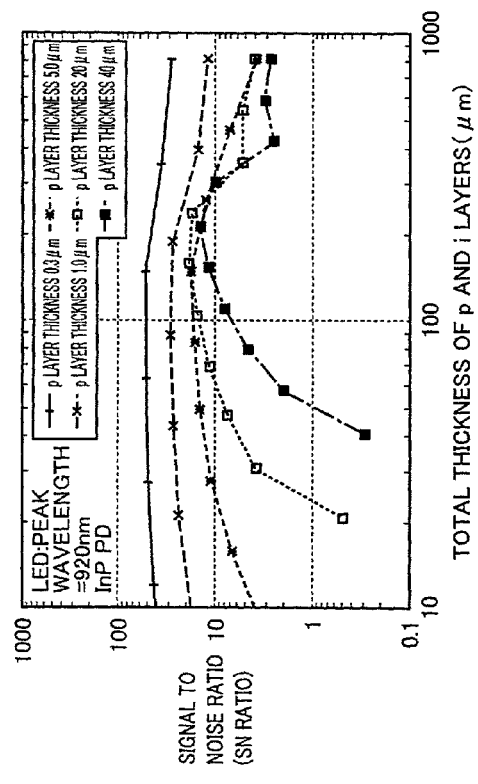
Figure 10B:
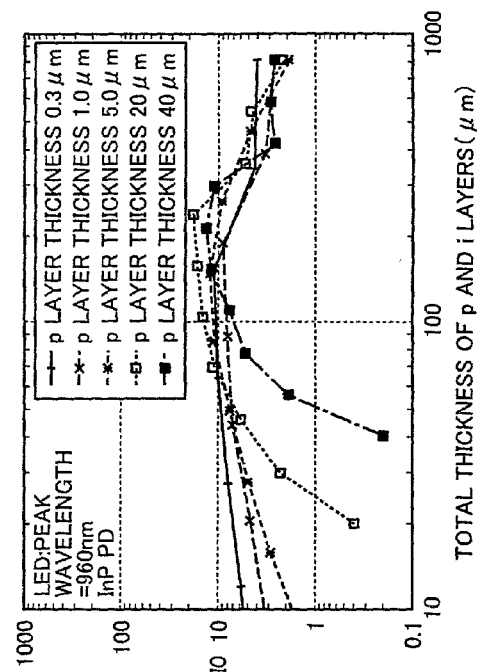
Figure 10C:
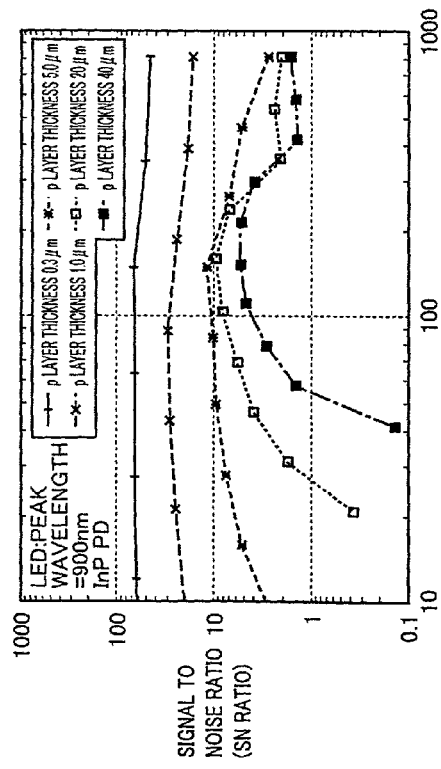
Figure 10D:
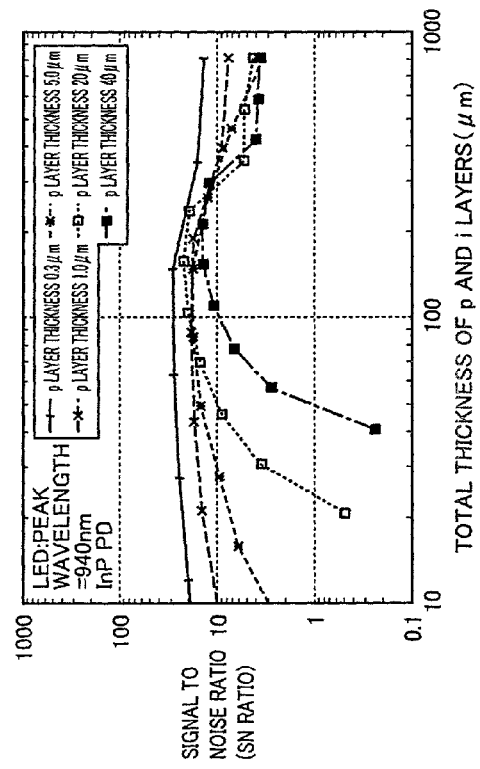

FIG. 9 represents the ratio of surviving photons with respect to the number of incident photons, when the light enters the InP light receiving element 2, where absorption coefficients are 1.0 (wavelength 900 nm), 0.07 (wavelength 930 nm), and 0.0005 $\mu m^{-1}$ (wavelength 950 nm). It can be seen from FIG. 9 that the light beam having the wavelength of 910 nm or shorter is mostly absorbed only by the uppermost p layer 33, and an effective electric signal cannot be taken out therefrom. Namely, it does not form even a noise. The light beam having the wavelength of 940 nm or longer is not much absorbed, and hence the light is passed through p layer 33 and i layer 32, and hence it does not cause much noise, either. More specifically, the wavelength range of the light that can be received by the above described light receiving element and that can be turned to the electric signal is about 900 to 50 nm. In other words, the InP light receiving element can be considered having an additional function of an optical filter having the wavelength range width of 50 nm.

The inventor prepared semiconductor laser devices and LEDs as in the first embodiment, and signal to noise ratio (SN ratio) at the time of reception by the InP light receiving element was measured. The peak wavelength of the laser devices and the LEDs was changed in the range of 860 to 1020 nm. The results of measurement of the LEDs and the semiconductor laser devices are represented in FIGS. 10A to 10D and 11A to 11D, respectively.

When the semiconductor laser device is used, the SN ratio begins to increase simultaneously as the wavelength is increased, the SN ratio increases abruptly when the wavelength exceeds 920 nm, and exhibits a peak near the wavelength of 940 nm. It is confirmed through experiment that when the wavelength is made still longer, the SN ratio abruptly degrades after 950 nm. By contrast, when the LED is used, the SN ratio tends to increase monotonously, as the peak wavelength is made longer.

Figure 12:
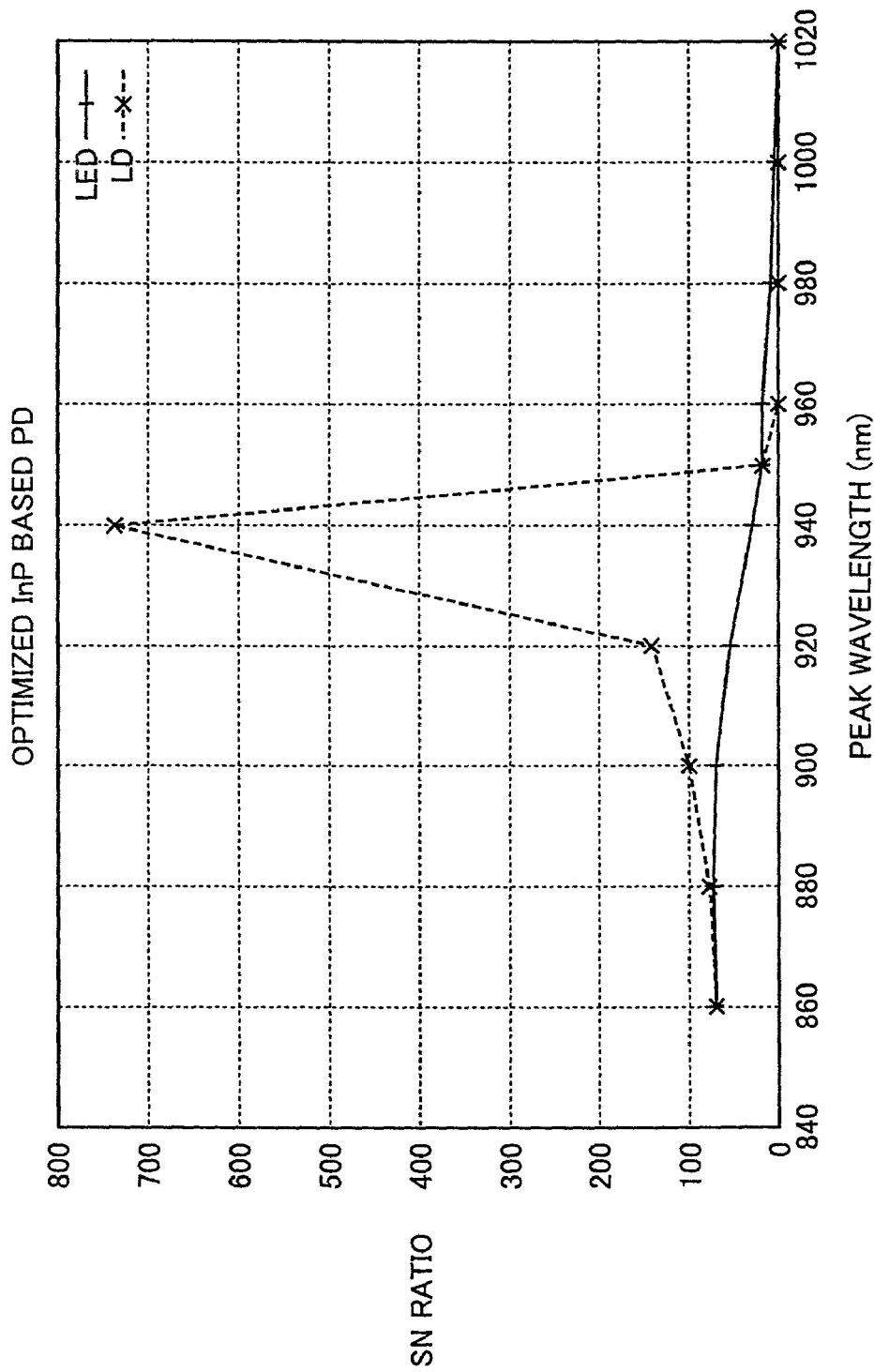
FIG. 12 represents relation between the peak wavelength and the SN ratio when an optimized InP based PD is used as the light receiving element in accordance with the second embodiment of the present invention.
Figure 13A:
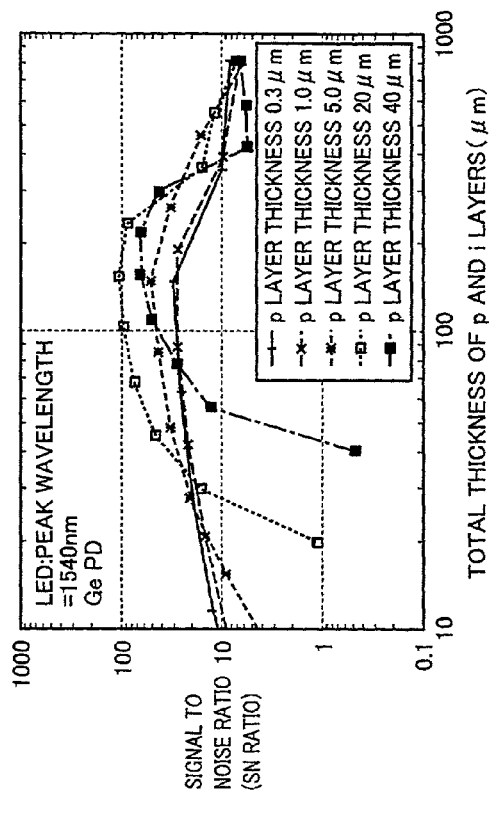
Figure 13B:
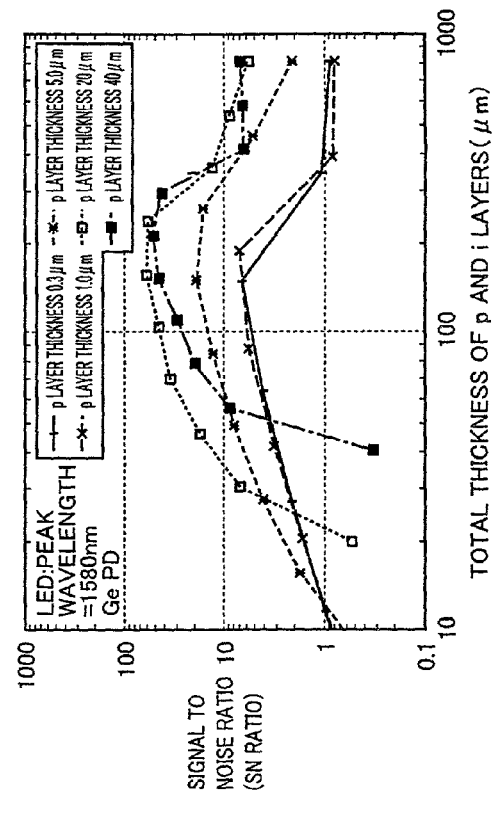
Figure 13C:
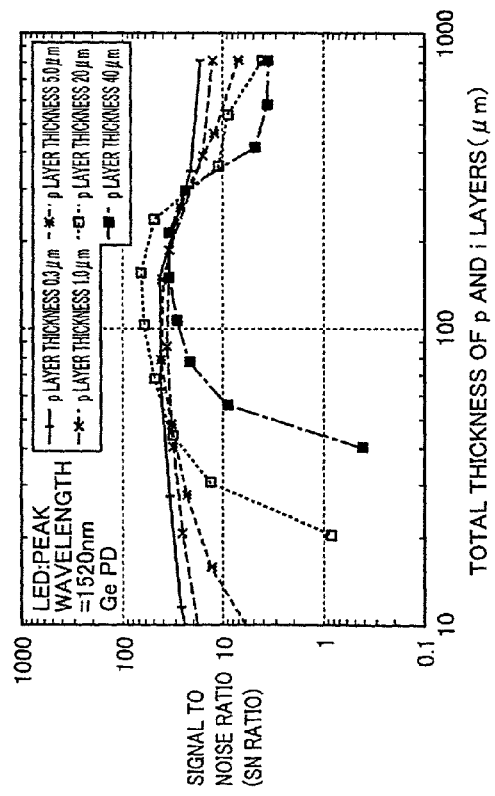
Figure 13D:
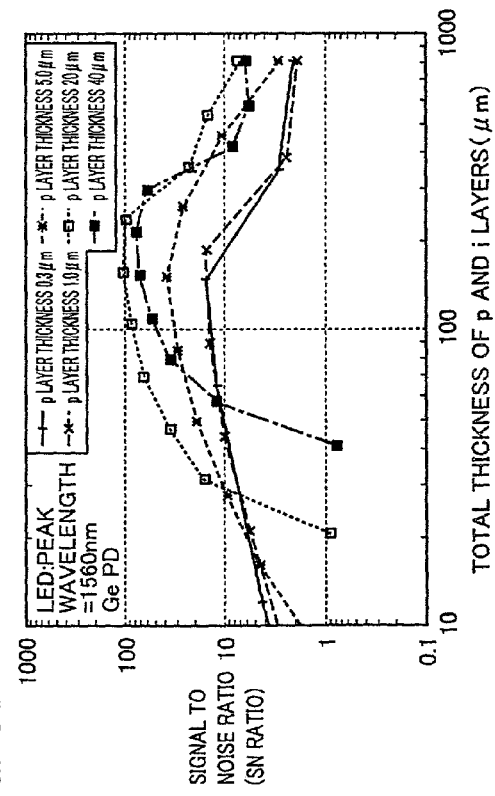
Figure 14A:
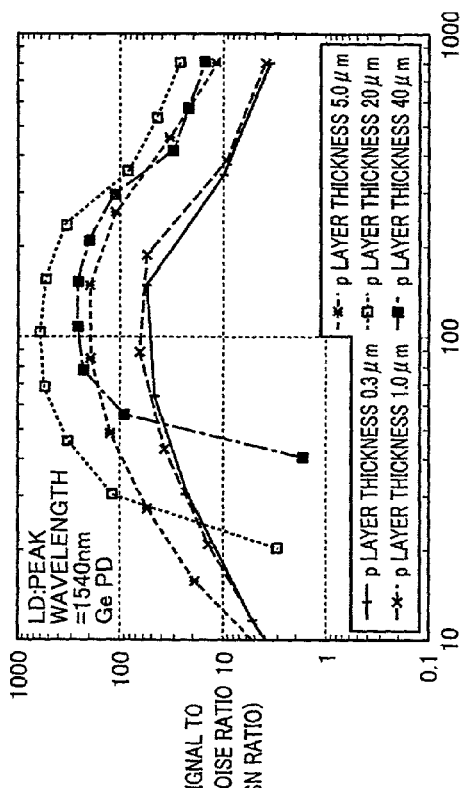
Figure 14B:
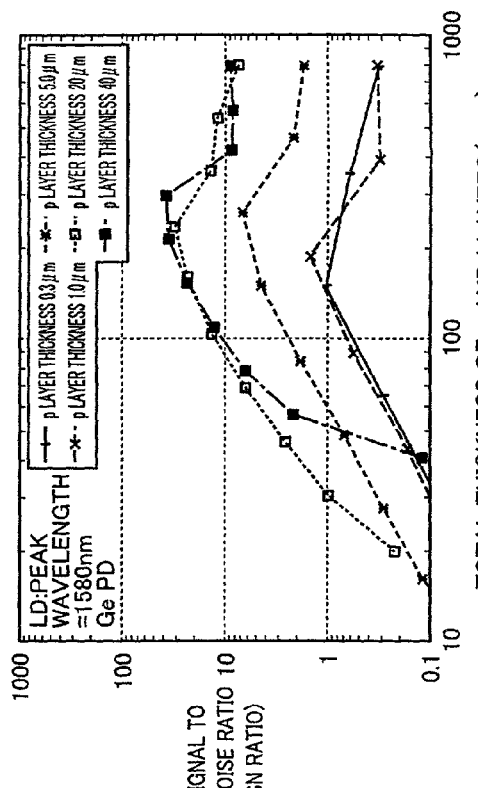
Figure 14C:
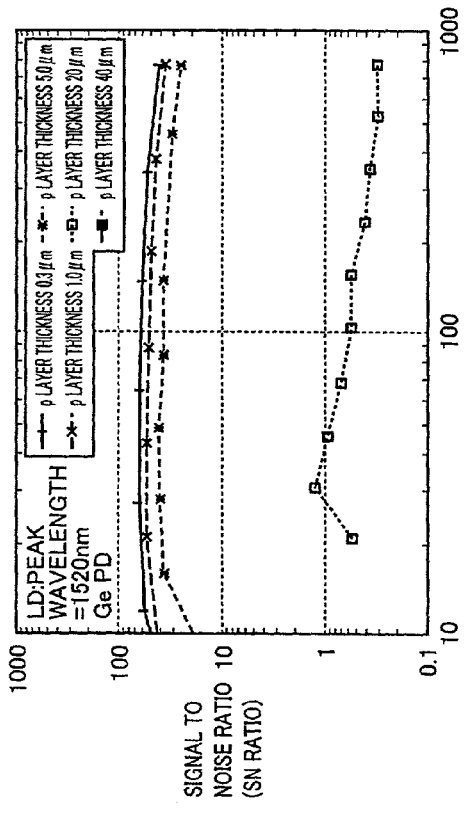
Figure 14D:
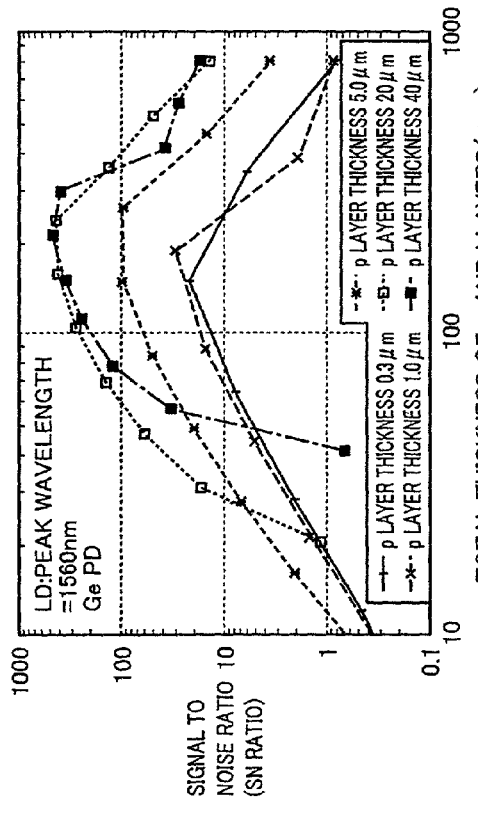

FIG. 12 represents the SN ratio when the layer thickness of the light receiving element is optimized for respective wavelengths. Referring to FIG. 12, the SN ratio of the semiconductor laser device is significantly larger than that of LED, in the wavelength range of 920 to 940 nm. It has been proved that when the InP based light receiving element is used as the light receiving element, an extremely high SN ratio that could not be obtained so far can be attained, if a semiconductor laser device is used as an emission light source and the wavelength is within the range of 920 to 940 nm. When the range of SN ratio higher than 80, which cannot be attained by the LED system, is to be obtained, the desirable combinations of the p and i layer thicknesses are as follows.

(1) The total thickness of the p and i layers is at least 100 $\mu m$.

(2) The thickness of the p layer is at least 5 μm, and the thickness of the i layer is at least 50 μm.

Figure 11A:
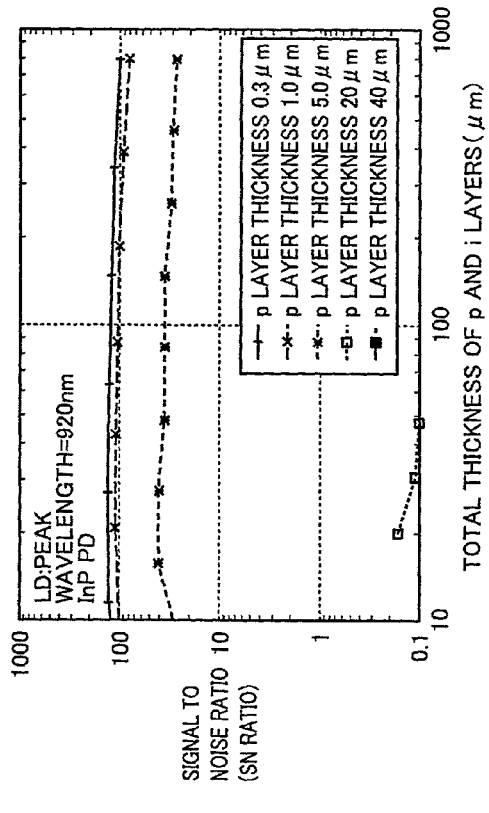
Figure 11B:
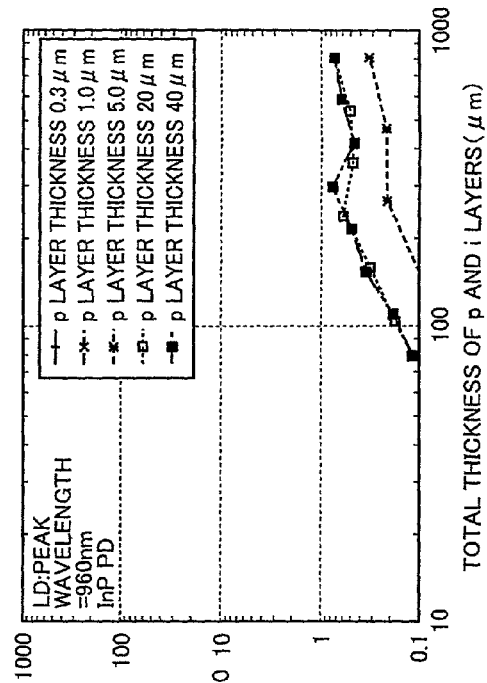
Figure 11C:
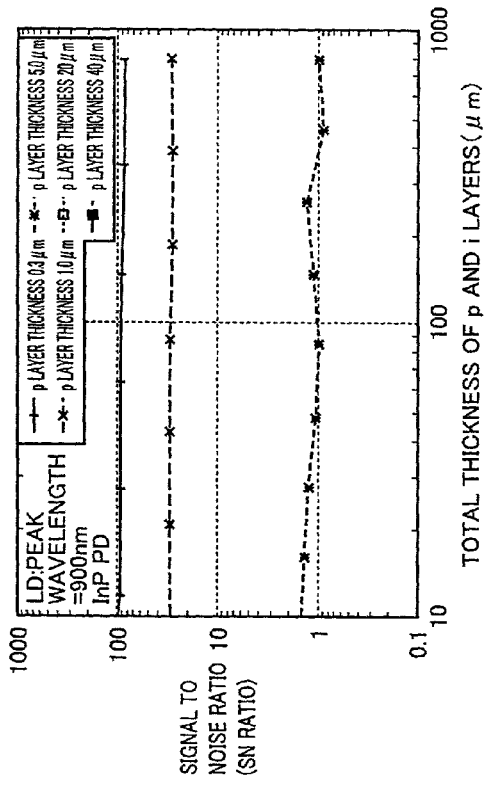
Figure 11D:
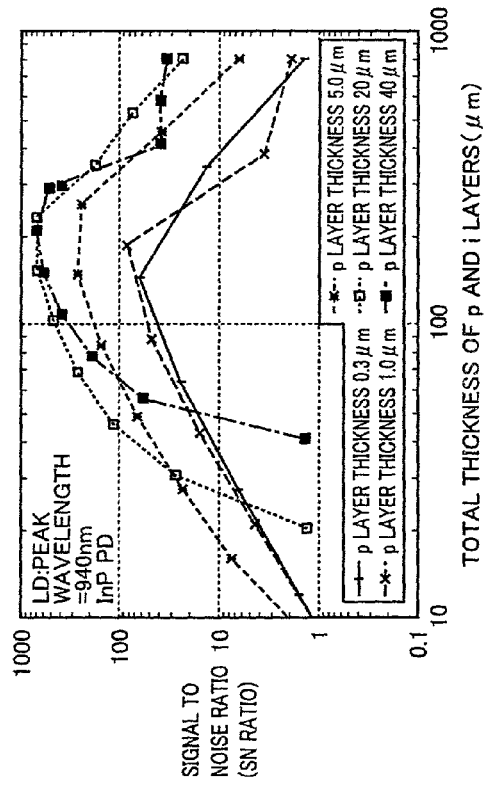

Further, as is apparent from FIG. 11C, when the thickness of the p layer is made 20 to 40 μm and the total thickness of the p and i layers is made about 200 μm, the maximum SN ratio can readily be attained.

Accordingly, when the oscillation wavelength of the laser device is set to 900 to 945 nm, it is the transition region where the absorption coefficient changes significantly and the absorption coefficient for the peak wavelength is 0.001 $\mu m^{-1}$, it becomes possible to perform optical filtering, using the difference in absorption coefficient. When an LED is used as the light source that is received by the light receiving element of such an InP based photodiode, even when the central wavelength is in the range of 900 to 945 nm, the emission is broad, the light out of the wavelength range of 900 to 945 nm does not result in any electric signal. Therefore, the intensity of the electric signal obtained from the LED light is significantly smaller than the signal intensity obtained from a light source of a line spectrum-like narrow line width within the wavelength range of 900 to 945 nm emitted from a semiconductor laser device. As the noise comes from the background light, the noise is the same for both examples. Therefore, SN ratio of the LED is significantly smaller. The large difference in SN ratio between LED and the LD is based on the assumption that the oscillation wavelength of the LD is in the range of 900 to 945 nm. This wavelength range corresponds to the absorption coefficient of 0.001 to 0.3 $\mu m^{-1}$, from the relation between the wavelength and absorption coefficient of InP shown in FIG. 4.

The absorption coefficient of the light receiving element differs significantly, dependent on the material forming the light receiving element, as can be seen from FIG. 4. A direct transition type photodiode such as InP has a sharp absorption end, and is suitable for such a use as described in the present embodiment. Though it is an indirect transition type light receiving element, a Ge photodiode has a sharp absorption end, and therefore, it can be used in the manner similar to InP.

Figure 15:
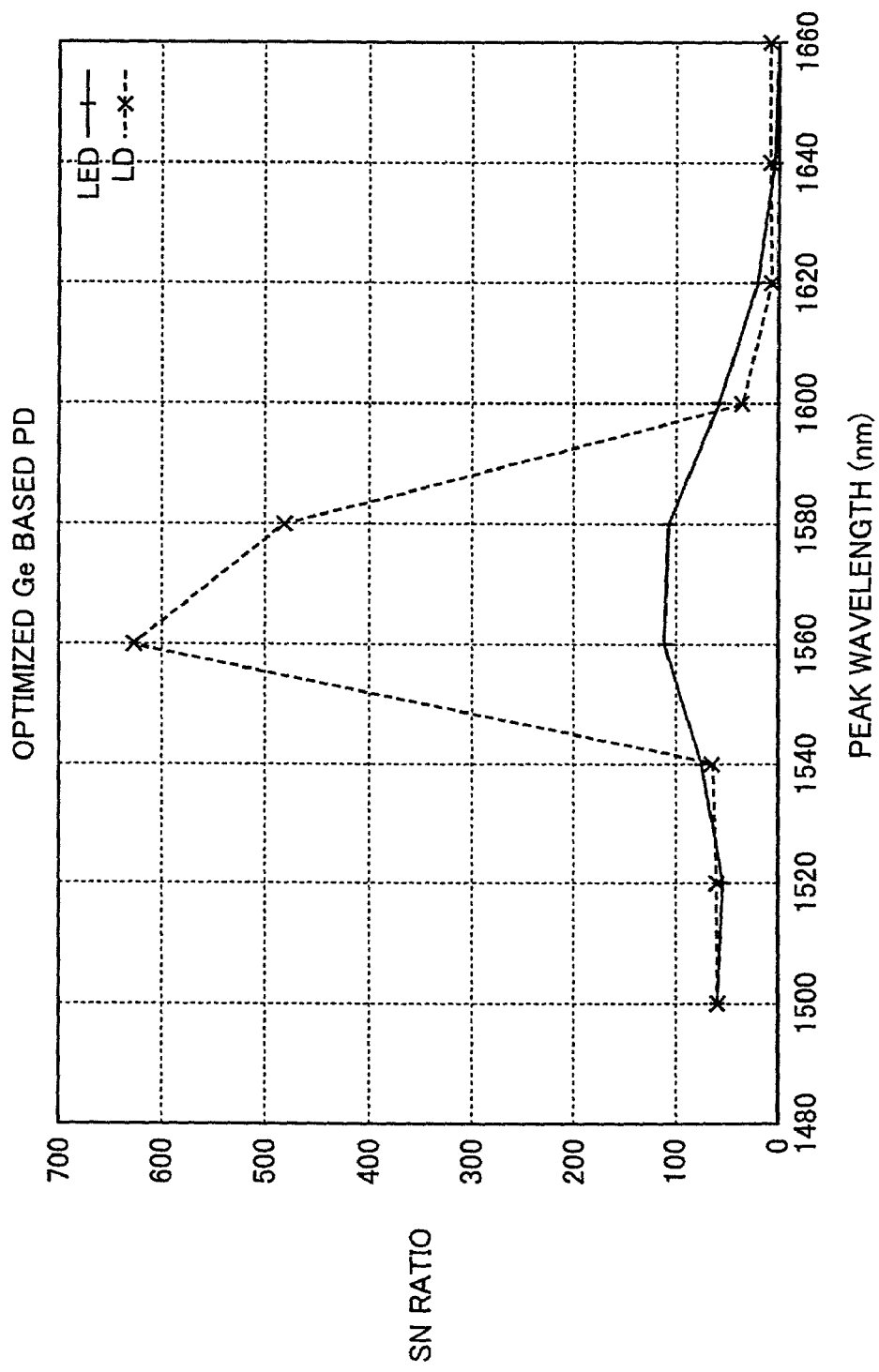
FIG. 15 represents relation between the peak wavelength and the SN ratio, when an optimized Ge based PD is used as the light receiving element in accordance with the second embodiment of the present invention.

The inventor conducted an experiment similar to that performed on the InP based semiconductor PD, on a Ge based semiconductor PD. The results of experiment are as shown in FIGS. 13A to 13D and 14A to 14D. FIG. 15 represents SN ratios of the PD structures optimized for respective peak wavelengths. As the change rate of the absorption coefficient is moderate for Ge as compared with InP, even when an LED is used, the SN ratio does not decrease monotonously simultaneously with the increase of the wavelength, and it has a peak at about 1560 to 1580 nm, similar to a semiconductor laser device. Here again, it has been proved that in order to attain the SN ratio higher than the maximum SN ratio of 100 obtained by the LED, it is necessary to set the thickness of the p layer to 22 to 40 μm and the thickness of the i layer to 60 to 300 μm.

In the case of Ge, it can be understood from FIG. 4 and equation (1) that the oscillation wavelength of the laser device should be 1.55 to 1.59 μm (1550 to 1590 nm). When the wavelength is shorter than 1.55 μm, the absorption by the p layer of the light receiving element is too large, so that most of the light is absorbed before it enters the i layer, and hence the light does not contribute to any signal. When the wavelength becomes longer than 1.59 μm, the light is not substantially absorbed either by the p layer or i layer but is passed therethrough, and hence the signal does not contribute to any signal, either.

The wavelength range mentioned above is, similarly, correspond to the absorption coefficient of 0.001 to 0.06 $\mu m^{-1}$, from FIG. 4. The laser beam in the wavelength band of 1.55 μm can be oscillated by an InP based laser device, or a GaInNAs based laser device.

When a Ge or a direct transition type photodiode is used as described above, the width of the wavelength range in which the absorption coefficient changes steeply over three to four orders is about 50 nm. When the light source of which wavelength expansion is 50 nm or smaller is used in the wavelength range, it is possible to significantly improve the SN ratio. A light source of which wavelength expansion is at most 50 nm can be realized by the semiconductor laser device (LD) and not by an LED.

In the spatial optical transmission module in accordance with the present embodiment, as a laser chip having the oscillation wavelength of 940 nm and an InP photodiode are used, the noise can significantly be reduced as compared with the conventional optical communication using an LED. Further, communication is possible between the optical transmitting/receiving apparatus and the conventional optical transmitting/receiving apparatus or an optical module formed of an Si light receiving element.

It is noted that a structure using a semiconductor laser having the wavelength of 1550 nm and a Ge light receiving element has higher safety with respect to one's eyes, as the wavelength is longer, and hence, it is possible to increase the optical output. This is as described in IEC60825-1, which is an international standardization reference.

Both the InP light receiving element and the Ge light receiving element can be applied to a light source having the wavelength width of at most 50 nm. As a light source having narrow width range, industrially, a semiconductor laser device is most preferable. The light emitting diode has too wide an emission width, and as the wavelength other than the range mentioned above does not contribute to any signal, the SN ratio degrades abruptly. As a semiconductor laser and a photodiode having light receiving sensitivity for a narrow band are used as in the present embodiment, it becomes unnecessary to provide an optical filter, and hence an optical transmitting/receiving apparatus can be formed at a low cost.

(Third Embodiment)

Figure 16:
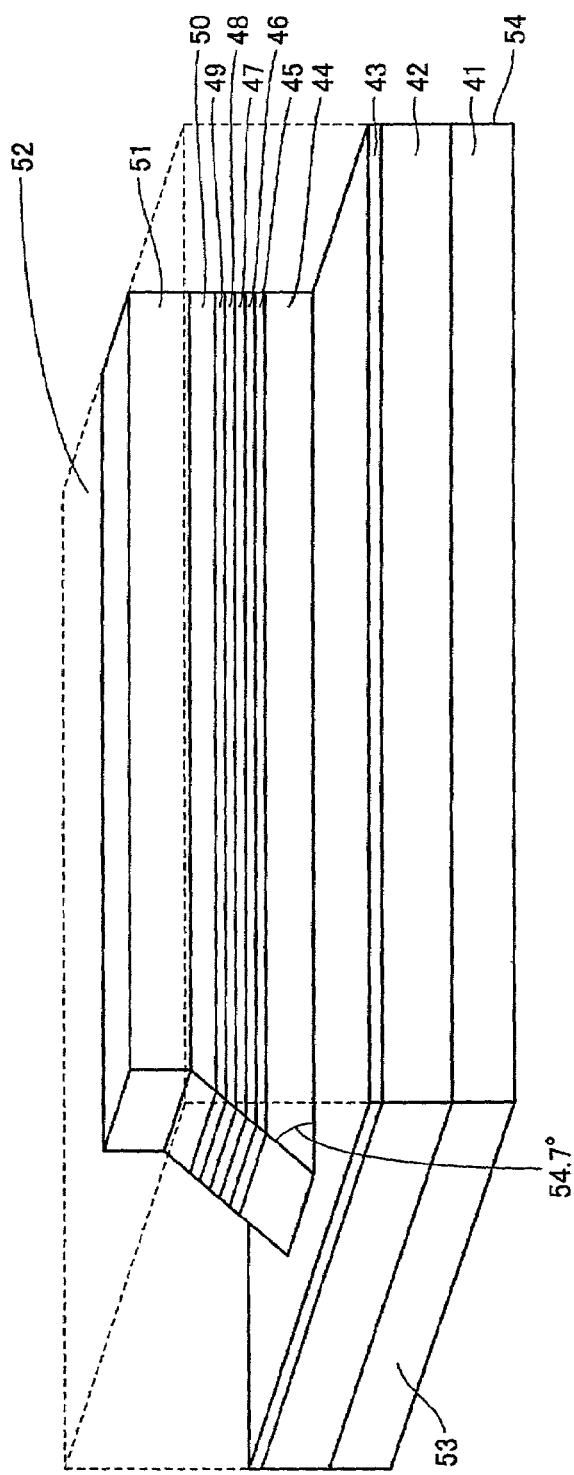
FIG. 16 is a perspective view showing the semiconductor laser device in accordance with a third embodiment of the present invention.

FIG. 16 shows a semiconductor laser device (laser chip) in accordance with the third embodiment of the present invention. Referring to FIG. 16, the steps of forming the semiconductor laser device will be described. On an n type GaAs substrate 41, the layers having the following compositions and thicknesses are stacked in order from the lower side. The numerical values in the parentheses following the names of the layers represent the thickness of the layer.

Namely, n type GaAs substrate 41/n type $Al_{0.5}$GaAs first clad layer 42 (1.6 μm)/n type GaAs etching stopper layer 43 (100 nm)/n type $Al_{0.5}$GaAs second clad layer 44 (15 μm)/ $Al_{0.5}$GaAs first guide layer 45 (20 nm)/$In_{0.1}$GaAs first well layer 46 (8 nm)/$Al_{0.1}$GaAs barrier layer 47 (5 nm)/$In_{0.1}$GaAs second well layer 48 (8 nm)/$Al_{0.1}$GaAs second guide layer 49 (20 nm).

The portion up to the $Al_{0.1}$GaAs second guide layer 49 serves as an active layer that causes laser oscillation at the wavelength of 920 nm. Finally, on the active layer, a p type $Al_{0.5}$GaAs third clad layer 50 (3 μm) and thereafter a p type As contact layer 51 (2 μm) are stacked.

Thereafter, in order to form a waveguide, a photomask is formed on the p type GaAs contact layer 51 through a common photo process. At this time, the direction of the waveguide is adapted to be in the <110> direction. Thereafter, using a sulfic acid based etchant, GaAs contact layer 51 is etched. Thereafter, using a hydrofluoric acid based etchant, the third clad layer 50, active layer 49, 48, 47, 46 and 45 as well as the second clad layer 44 are etched. The etching automatically stops at the etching stopper layer 43. Here, the sulfuric acid based etchant does not have plane direction dependency, and hence results in an almost vertical etching surface. The hydrofluoric acid based etchant, however, has a plane direction dependency, and therefore, at the surface vertical to the direction of the waveguide, a $\{111\}_A$ plane is exposed, and an angle formed with the direction of the waveguide is about 54.7 degrees.

The side surface of the waveguide may have a quasi mesa structure or anti mesa structure, dependent on the etching condition. Further, an almost vertical plane may be formed as shown in the figure. An SiN film 52 is embedded on the side surface of the waveguide, so that an upper part of the electrode contact layer 51 protrudes from the embedded layer. A metal electrode, not shown, is deposited on the upper surface, thus providing a positive electrode. Transparent electrode material, not shown, is provided on the lower surface, thus providing a negative electrode. Finally, one side is cleaved at a portion where the waveguide is disconnected, to form a surface 54. Thereafter, on the side of the surface 54, a highly reflective film of $TiO_2$, $SiO_2$ or the like is formed by vacuum vapor deposition.

Next, the function of the semiconductor laser will be described. When a current is caused to flow from the positive electrode to the negative electrode, light is excited in the active layer and propagated through the waveguide. The waveguide has a refractive index of about 3.4, and SiN film has the refractive index of about 1.6. Therefore, the light is not refracted from the waveguide into SiN film but fully reflected and radiated to the side of the substrate 41. As one surface 54 has a highly reflective film vapor-deposited thereon, there is no optical feedback from the side of the surface 53 in the laser device, and a great optical feedback is caused from the side of the surface 54, thus resulting in laser oscillation. The active layer is so designed as to attain the laser oscillation wavelength of 920 nm.

Figure 17:
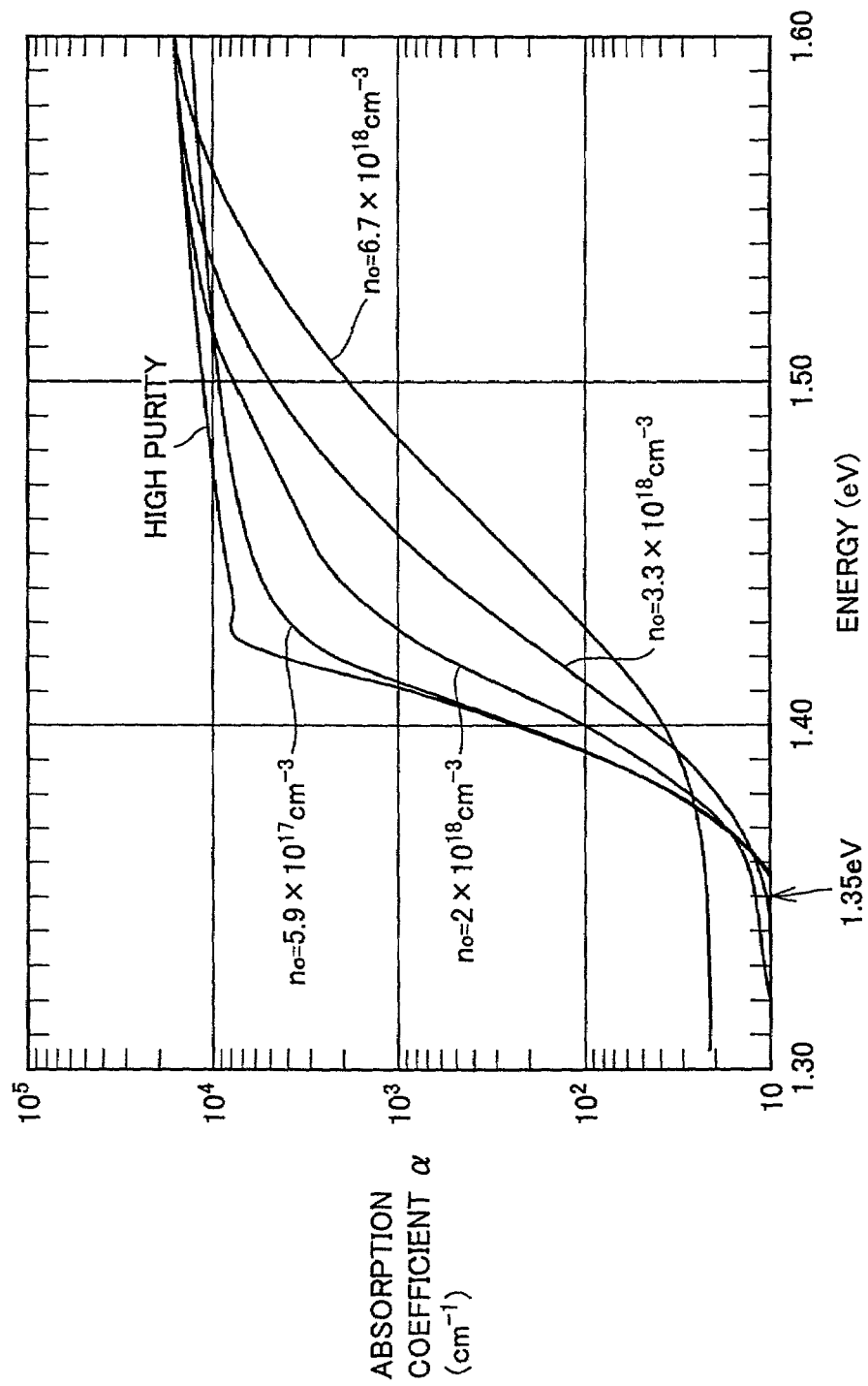
FIG. 17 represents relation between absorption coefficient, energy (wavelength) and impurity concentration in the semiconductor laser device of FIG. 16.

FIG. 17 shows energy (wavelength) dependency of the absorption coefficient of the n type GaAs. In this example, an n type GaAs substrate with the dosage of 2 to $4 \times 10^{18}$ cm$^{-3}$ is used. At the energy of 1.35 eV that corresponds to the wavelength of 920 nm, the absorption coefficient is at most 10 cm$^{-1}$. In case of a GaAs substrate having the thickness of 100 μm, this represents that, according to equation (1), the transmittance is about 90%. Actually, when the absorption coefficient is about 30 cm$^{-1}$, transmittance of at least 70% can be ensured for the GaAs substrate having the thickness of 100 μm. Therefore, when the optical energy is about 1.39 eV, that is, when the wavelength is about 890 nm or longer, the effect of the present invention of the laser chip is attained.

Figure 18:
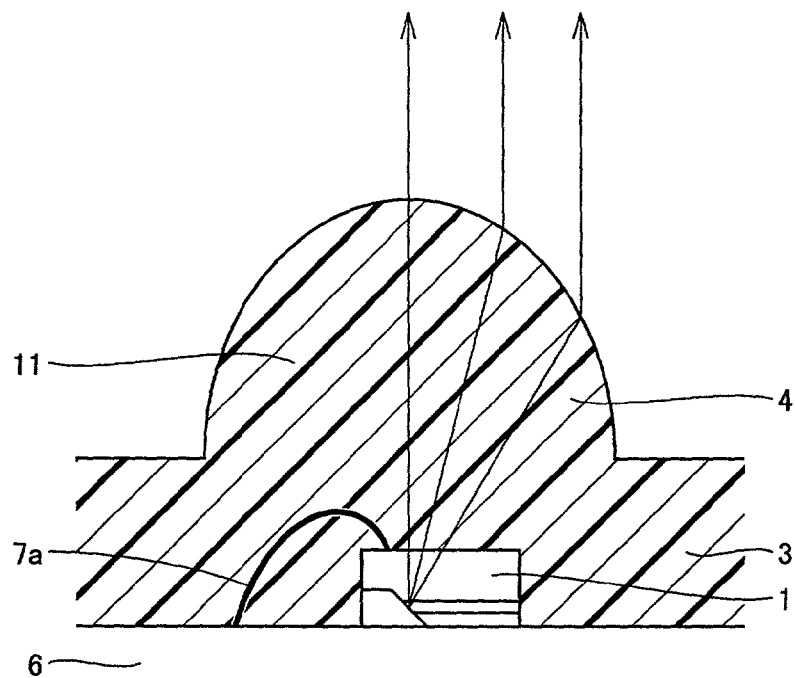
FIG. 18 shows a light emitting portion of a spatial optical transmission module incorporating the semiconductor laser device in accordance with the third embodiment of the present invention.

The function realized when the semiconductor laser device is mounted on an optical transmitting/receiving apparatus will be described. FIG. 18 shows only a data transmitting portion (light emitting portion) of a spatial optical transmission module. In the present example, semiconductor laser device 1 is mounted on circuit board 6 with the positive electrode (not shown) facing downward. For the mounting, a silver paste, not shown, is applied by an appropriate amount to circuit board 6, semiconductor laser device 1 is adhered, and cured at 80° C. for a few minutes. The negative electrode (not shown) of the semiconductor laser device is connected by a wire 7a to an electrode (not shown) of circuit board 6. An upper portion of the semiconductor laser device is molded by a transparent resin 3 to which a diffuser 11 for diffusing light has been mixed, and by the same resin, a mold lens 4 is formed.

As already described, the light reflected from the waveguide is propagated through resin 3, and the center of progress thereof is slightly deviated from the angle from the above. As already described, it is a general practice to use transmitting/receiving integral type modules facing with each other. Therefore, it is preferred that the light beam emitted from mold lens 4 proceeds upward. The mold lens of the present example is designed such that the light entering from above is focused on a reflecting surface of semiconductor laser device 1. Therefore, the optical beam that is in the opposite direction, that is, emitted obliquely from the vicinity of the focal point, is radiated to the space above. At this time, as there is the diffuser, the beam radiated to the space actually comes to be a beam having a certain expansion upward. The angle of expansion is determined by the density of the diffuser, and the expansion angle is the same both in the longitudinal and lateral directions. Such emission and entrance of light is preferred for a light emitting portion of the optical transmitting/receiving module. As the receiving portion, a light receiving element described with respect to the first embodiment is used. When the semiconductor laser device of the present embodiment and the light receiving element of InP described with reference to the second embodiment are used, it becomes unnecessary to use a mold resin for optical filter, such as a black carbon, as already described in the second embodiment. Therefore, in the present example, for better design, an opaque resin with diffuser is used as the mold resin.

The effect of the present invention will be described next. By using the semiconductor laser device of the present embodiment, it becomes possible to take out the laser beam emitted upward from the upper surface, without using a special heat sink. Further, as the GaAs substrate has lower thermal conductivity as compared with metal, it is desired that the distance between the laser emitting portion, as a main heat generating portion, and the circuit board 6 is short. In the present example, absorption by the GaAs substrate can be minimized, by setting the wavelength to be 890 nm or longer. Thus, die-bonding of the laser emitting portion facing downward to the circuit board 6, that is, a so-called junction down type device mounting becomes possible.

Figure 19:
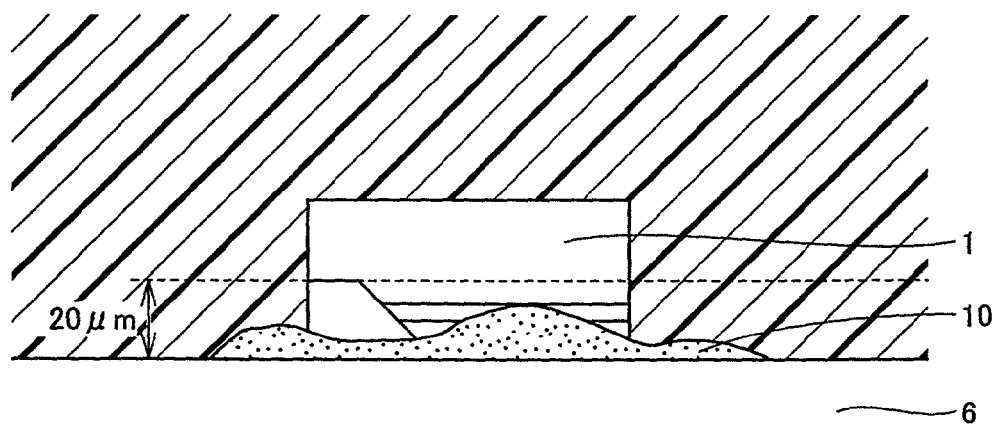
FIG. 19 is a partial enlargement of FIG. 18.

In addition, referring to FIG. 19, the thickness of SiN embedded film is about 20 μm in the semiconductor laser device 1 of the present example, which film covers a side surface of the pn junction. Therefore, even when silver paste 10 used at the time of die-bonding climbs up, leakage of current can be prevented when the climbing is at most 20 μm. Further, the optical filter becomes unnecessary, allowing selection of a mold resin. Further, the SiN film has a function of protecting an end surface, and therefore, a highly reliable laser chip can be realized by a simple method.

(Fourth Embodiment)

Figure 20:
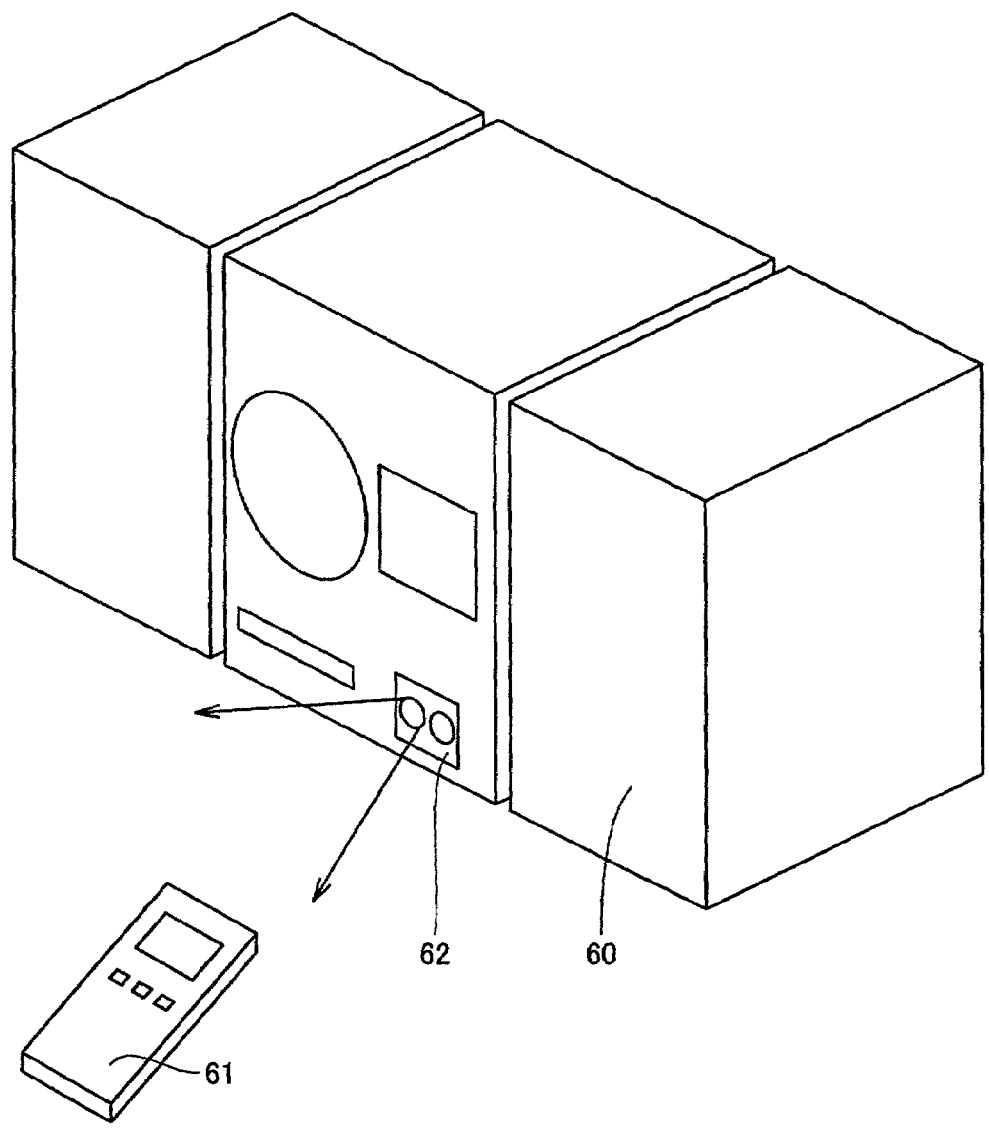
FIG. 20 is a perspective view of an electronic appliance (mini disk player) in accordance with a fourth embodiment of the present invention.
Figure 21:
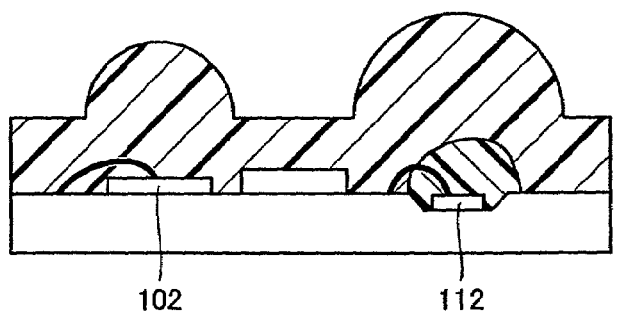
FIG. 21 is a cross section of a conventional spatial optical transmission module.
Figure 22:
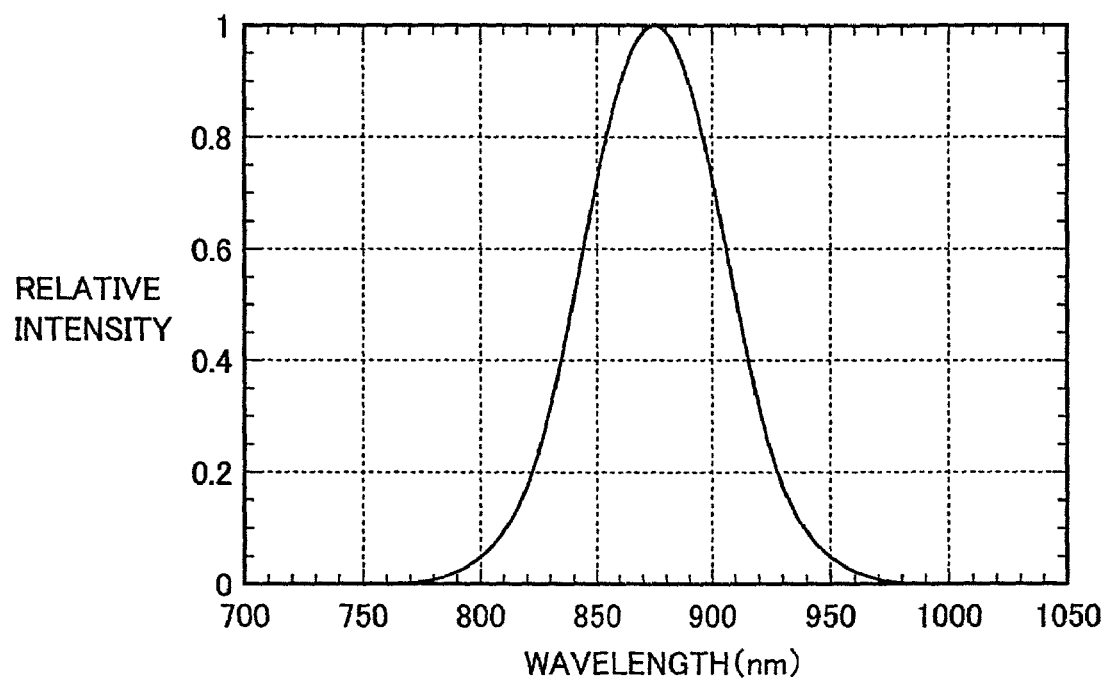
FIG. 22 represents emission spectrum of an LED used as a light source of the conventional spatial optical transmission module.

The fourth embodiment of the present invention will be described with reference to FIG. 20. FIG. 20 is a perspective view showing a mini disk player 60 mounting the spatial optical transmission module 62 in accordance with the third embodiment of the present invention and a remote controller 61. Mini disk player 60 has the entire surface finished with silver aluminum. The mold resin in accordance with the third embodiment is opaque, and hence good color balance with the silver case can be attained, thus improving the value of the overall system as a product. The present embodiment provides an optical transmitting/receiving module that matches the color of the product, for improved design.

Further, by the use of the spatial optical transmission system of the present invention, it becomes possible for the first time to provide a transparent mold resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A spatial optical transmission system, comprising:
a semiconductor laser device oscillating a laser beam; and
a light receiving element receiving and converting to an electric signal the laser beam emitted from said semiconductor laser device and propagated through a space; wherein
a light diffusion region for diffusing light in a region through which laser light emitted from the semiconductor laser device reaches a free space;
said light receiving element is formed of a silicon based photodiode, and
said semiconductor laser device emits the laser light of an oscillation wavelength in a range of 885 to 980 nm.

2. The spatial optical transmission system according to claim 1, wherein said semiconductor laser device is a divergent light source from which the laser beam is emitted, the intensity of illumination attenuating with a distance from said light source.

3. The spatial optical transmission system according to claim 1, wherein said light receiving element is formed of a Si based or InP based photodiode, and includes, from an entering surface side where said laser beams enters, a first conductivity type semiconductor layer having a thickness of 5 to 25 $\mu$m, an intrinsic semiconductor layer having a thickness of 60 to 200 $\mu$m positioned below the first conductivity type semiconductor layer, and a second conductivity type semiconductor layer positioned below the intrinsic semiconductor layer.

4. The spatial optical transmission system according to claim 1, wherein said semiconductor laser device emits the laser light of an oscillation wavelength in a range of 891 to 980 nm.

5. The spatial optical transmission system according to claim 1, wherein data in the form of light is radiated in a space.

6. A spatial optical transmission system, comprising:
a semiconductor laser device oscillating a laser beam; and
a light receiving element receiving and converting to an electric signal the laser beam emitted from said semiconductor laser device and propagated through a space; wherein
said light receiving element is formed of an InP based photodiode, and
said semiconductor laser device emits the laser light of an oscillation wavelength in a range of 900 to 945 nm.

7. A spatial optical transmission system, comprising:
a semiconductor laser device oscillating a laser beam; and
a light receiving element receiving and converting to an electric signal the laser beam emitted from said semiconductor laser device and propagated through a space; wherein
a light diffusion region for diffusing light in a region through which laser light emitted from the semiconductor laser device reaches a free space;
said light receiving element is formed of an Ge based photodiode, and
said semiconductor laser device emits the laser light of an oscillation wavelength in a range of 1550 to 1590 nm.

8. The spatial optical transmission system according to claim 7, wherein said light emitting element is formed of a Ge based photodiode, and includes, from an entering surface side where said laser beam enters, a first conductivity type semiconductor layer having a thickness of 20 to 40 $\mu$m, an intrinsic semiconductor layer having a thickness of 60 to 250 $\mu$m positioned below the first conductivity type semiconductor layer, and a second conductivity type semiconductor layer positioned below the intrinsic semiconductor layer.

9. A spatial optical transmission system, comprising:
a semiconductor laser device oscillating a laser beam; and
a light receiving element receiving and converting to an electric signal the laser beam emitted from said semiconductor laser device and propagated through a space; wherein
said light receiving element is formed of a silicon based photodiode,
said semiconductor laser device emits the laser light of an oscillation wavelength in a range of 885 to 980 nm, and
said light receiving element has an absorption coefficient, and wherein said semiconductor laser device oscillates said laser beam having a wavelength for which the absorption coefficient at said light receiving element is in a range of 0.001 to 0.3 $\mu m^{-1}$.

10. The system of claim 9, wherein said semiconductor laser device oscillates said laser beam having a wavelength for which the absorption coefficient at said light receiving element is in a range of 0.007 to 0.04 $\mu m^{-1}$.

11. A spatial optical transmission system, comprising:
a semiconductor laser device oscillating a laser beam; and
a light receiving element receiving and converting to an electric signal the laser beam emitted from said semiconductor laser device and propagated through a space; wherein
said light receiving element is formed of an InP based photodiode,
said semiconductor laser device emits the laser light of an oscillation wavelength in a range of 900 to 945 nm, and
said light receiving element has an absorption coefficient, and wherein said semiconductor laser device oscillates said laser beam having a wavelength for which the absorption coefficient at said light receiving element is in a range of 0.001 to 0.3 $\mu m^{-1}$.

12. The system of claim 11, wherein said semiconductor laser device oscillates said laser beam having a wavelength for which the absorption coefficient at said light receiving element is in a range of 0.007 to 0.04 $\mu m^{-1}$.

* * * * *